(12) United States Patent
Namgoong et al.

(10) Patent No.: US 12,245,251 B2
(45) Date of Patent: *Mar. 4, 2025

(54) DISTORTION PROBING REFERENCE SIGNALS

(71) Applicant: QUALCOMM Incorporated, San Diego, CA (US)

(72) Inventors: June Namgoong, San Diego, CA (US); Taesang Yoo, San Diego, CA (US); Naga Bhushan, San Diego, CA (US); Tingfang Ji, San Diego, CA (US); Krishna Kiran Mukkavili, San Diego, CA (US); Jay Kumar Sundararajan, San Diego, CA (US); Pavan Kumar Vitthaladevuni, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/324,005

(22) Filed: May 25, 2023

(65) Prior Publication Data

US 2023/0300850 A1    Sep. 21, 2023

Related U.S. Application Data

(63) Continuation of application No. 17/136,840, filed on Dec. 29, 2020, now Pat. No. 11,737,106.

(Continued)

(51) Int. Cl.
*H04W 72/23* (2023.01)
*H03F 1/32* (2006.01)
(Continued)

(52) U.S. Cl.
CPC .......... *H04W 72/23* (2023.01); *H03F 1/3247* (2013.01); *H04L 5/0048* (2013.01); *H04W 72/0473* (2013.01)

(58) Field of Classification Search
CPC . H04W 72/23; H04W 72/0473; H03F 1/3247; H04L 5/0048; H04L 27/2614;
(Continued)

(56) References Cited

U.S. PATENT DOCUMENTS 9,083,593 B2    7/2015  Xin et al.
10,153,793 B2  12/2018  Hausmair et al.
(Continued)

FOREIGN PATENT DOCUMENTS

| CN | 109921822 A | 6/2019 |
| CN | 110710114 A | 1/2020 |
| EP | 3190732 A1  | 7/2017 |

OTHER PUBLICATIONS

Gregorio F.H., et al., "Receiver-Side Nonlinearities Mitigation Using an Extended Iterative Decision-based Technique," Signal Processing, vol. 91, 2011, pp. 2042-2056.

(Continued)

*Primary Examiner* — Justin T Van Roie
(74) *Attorney, Agent, or Firm* — Holland & Hart LLP

(57) ABSTRACT

Methods, systems, and devices for wireless communications are described. A first device and a second device may communicate via a channel. The first device may generate and transmit a reference signal, which may be a distortion probing reference signal with a high peak to average power ratio. In one implementation, the first device may use the reference signal as an input for a neural network model to learn a nonlinear response of the second device transmission components. In another implementation, the second device may sample the generated reference signal, and use the samples as inputs for a neural network model to learn the nonlinear response. The first device and the second device may exchange signaling based on learning the nonlinear (Continued)

response, and each device may compensate for the nonlinear response when communicating via the channel.

16 Claims, 16 Drawing Sheets

Related U.S. Application Data

(60) Provisional application No. 62/980,869, filed on Feb. 24, 2020.

(51) Int. Cl.
  *H04L 5/00* (2006.01)
  *H04W 72/044* (2023.01)

(58) Field of Classification Search
  CPC ............... H04L 27/2613; H04L 5/0094; H04L 25/03866; H04L 27/366
  See application file for complete search history.

(56) References Cited

U.S. PATENT DOCUMENTS

| | | | |
|---|---|---|---|
| 10,476,589 | B2 | 11/2019 | Heath et al. |
| 10,531,415 | B2 | 1/2020 | O'Shea et al. |
| 11,153,179 | B2 | 10/2021 | Zeng et al. |
| 11,737,106 | B2 * | 8/2023 | Namgoong ......... H04L 27/2613 370/329 |
| 2018/0367192 | A1 | 12/2018 | O'Shea et al. |
| 2018/0367674 | A1 | 12/2018 | Schalk-Schupp et al. |
| 2019/0363911 | A1 | 11/2019 | Choi et al. |
| 2021/0119713 | A1 | 4/2021 | O'Shea et al. |
| 2021/0266950 | A1 | 8/2021 | Namgoong et al. |

OTHER PUBLICATIONS

Huang C., et al., "Deep Learning for UL/DL Channel Calibration in Generic Massive MIMO Systems", Singapore University of Technology and Design, May 13, 2019, 6 Pages.

International Search Report and Written Opinion—PCT/US2020/067505—ISA/EPO—Apr. 23, 2021.

Sonal M., "Machine Learning for PAPR Distortion Reduction in OFDM Systems," Sweden 2016, 69 pages.

Ye H., et al., "Power of Deep Learning for Channel Estimation and Signal Detection in OFDM Systems", IEEE Wireless Communications Letters, vol. 7, No. 1, Aug. 28, 2017 (Aug. 28, 2017), pp. 1-4, XP055486957, Piscataway, NJ, USA, ISSN: 2162-2337, DOI: 10.1109/LWC.2017.2757490, p. 1-p. 4.

Zhou Z., et al., "Learning for Detection: MIMO-OFDM Symbol Detection through Downlink Pilots", arxiv.org, Cornell University Library, 201 OLIN Library Cornell University, Ithaca, NY, 14853, Jun. 25, 2019 (Jun. 25, 2019), pp. 1-32, XP081500629, 20191020, the whole document.

* cited by examiner

DISTORTION PROBING REFERENCE SIGNALS

CROSS REFERENCE

The present Application for Patent is a continuation of U.S. patent application Ser. No. 17/136,840 by NAM-GOONG et al., entitled "DISTORTION PROBING REFERENCE SIGNALS," and filed Dec. 29, 2020, which claims the benefit of U.S. Provisional Patent Application No. 62/980,869 by NAMGOONG et al., entitled "DISTORTION PROBING REFERENCE SIGNALS," filed Feb. 24, 2020, assigned to the assignee hereof, and expressly incorporated by reference herein.

INTRODUCTION

The following relates generally to wireless communications and more specifically to reference signals.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal frequency division multiple access (OFDMA), or discrete Fourier transform spread orthogonal frequency division multiplexing (DFT-S-OFDM). A wireless multiple-access communications system may include one or more base stations or one or more network access nodes, each simultaneously supporting communication for multiple communication devices, which may be otherwise known as user equipment (UE).

SUMMARY

A method for wireless communications at a first device is described. The method may include transmitting an indication configuring a second device to transmit a first reference signal with a first peak to average power ratio and a second reference signal with a second peak to average power ratio that is greater than the first peak to average power ratio, where the second reference signal is for probing a nonlinear response, receiving, from the second device, the first reference signal and the second reference signal based on transmitting the indication, determining a neural network model and one or more neural network weights corresponding to one or more transmission parameters associated with the second device based on a channel estimate from the first reference signal and the second reference signal, estimating a transmission encoding metric and a reception decoding metric associated with the first reference signal and the second reference signal based on the neural network model and the one or more neural network weights, transmitting signaling associated with the neural network model and the one or more neural network weights based on the estimating, and communicating with the second device based on the reception decoding metric.

An apparatus for wireless communications at a first device is described. The apparatus may include a processor, memory coupled with the processor, and instructions stored in the memory. The instructions may be executable by the processor to cause the apparatus to transmit an indication configuring a second device to transmit a first reference signal with a first peak to average power ratio and a second reference signal with a second peak to average power ratio that is greater than the first peak to average power ratio, where the second reference signal is for probing a nonlinear response, receive, from the second device, the first reference signal and the second reference signal based on transmitting the indication, determine a neural network model and one or more neural network weights corresponding to one or more transmission parameters associated with the second device based on a channel estimate from the first reference signal and the second reference signal, estimate a transmission encoding metric and a reception decoding metric associated with the first reference signal and the second reference signal based on the neural network model and the one or more neural network weights, transmit signaling associated with the neural network model and the one or more neural network weights based on the estimating, and communicate with the second device based on the reception decoding metric.

Another apparatus for wireless communications at a first device is described. The apparatus may include means for transmitting an indication configuring a second device to transmit a first reference signal with a first peak to average power ratio and a second reference signal with a second peak to average power ratio that is greater than the first peak to average power ratio, where the second reference signal is for probing a nonlinear response, means for receiving, from the second device, the first reference signal and the second reference signal based on transmitting the indication, means for determining a neural network model and one or more neural network weights corresponding to one or more transmission parameters associated with the second device based on a channel estimate from the first reference signal and the second reference signal, means for estimating a transmission encoding metric and a reception decoding metric associated with the first reference signal and the second reference signal based on the neural network model and the one or more neural network weights, means for transmitting signaling associated with the neural network model and the one or more neural network weights based on the estimating, and means for communicating with the second device based on the reception decoding metric.

A non-transitory computer-readable medium storing code for wireless communications at a first device is described. The code may include instructions executable by a processor to transmit an indication configuring a second device to transmit a first reference signal with a first peak to average power ratio and a second reference signal with a second peak to average power ratio that is greater than the first peak to average power ratio, where the second reference signal is for probing a nonlinear response, receive, from the second device, the first reference signal and the second reference signal based on transmitting the indication, determine a neural network model and one or more neural network weights corresponding to one or more transmission parameters associated with the second device based on a channel estimate from the first reference signal and the second reference signal, estimate a transmission encoding metric and a reception decoding metric associated with the first reference signal and the second reference signal based on the neural network model and the one or more neural network weights, transmit signaling associated with the neural network model and the one or more neural network weights based on the estimating, and communicate with the second device based on the reception decoding metric.

In some examples of the method, apparatuses, and non-transitory computer-readable medium described herein, transmitting the signaling may include operations, features, means, or instructions for transmitting an indication of the transmission encoding metric associated with the first reference signal and the second reference signal.

In some examples of the method, apparatuses, and non-transitory computer-readable medium described herein, transmitting the signaling may include operations, features, means, or instructions for transmitting a grant scheduling a transmission that may be encoded based on the transmission encoding metric, where communicating with the second device includes receiving the scheduled transmission.

In some examples of the method, apparatuses, and non-transitory computer-readable medium described herein, the grant includes an uplink grant in a downlink control information message and the scheduled transmission includes an uplink shared channel transmission.

Some examples of the method, apparatuses, and non-transitory computer-readable medium described herein may further include operations, features, means, or instructions for determining the channel estimate based on receiving the first reference signal, where communicating with the second device may be further based on the determined channel estimate.

In some examples of the method, apparatuses, and non-transitory computer-readable medium described herein, the neural network model and the one or more neural network weights correspond to a nonlinear response associated with transmissions at the second device, the transmission encoding metric includes a second neural network model and a second one or more neural network weights associated with encoding the transmissions at the second device based on the nonlinear response, and the reception decoding metric includes a third neural network model and a third one or more neural network weights associated with decoding transmissions received at the first device based on the nonlinear response.

In some examples of the method, apparatuses, and non-transitory computer-readable medium described herein, the first reference signal includes a demodulation reference signal.

In some examples of the method, apparatuses, and non-transitory computer-readable medium described herein, the second reference signal includes a set of contiguous symbols in a time domain.

A method for wireless communications at a second device is described. The method may include receiving an indication configuring the second device to transmit a first reference signal with a first peak to average power ratio and a second reference signal with a second peak to average power ratio that is greater than the first peak to average power ratio, where the second reference signal is for probing a nonlinear response, transmitting, to a first device, the first reference signal and the second reference signal based on receiving the indication, receiving signaling associated with a neural network model and one or more neural network weights corresponding to one or more transmission parameters, where the neural network model and the one or more neural network weights are based on a channel estimate from the first reference signal and the second reference signal, and communicating with the first device based on the received signaling.

An apparatus for wireless communications at a second device is described. The apparatus may include a processor, memory coupled with the processor, and instructions stored in the memory. The instructions may be executable by the processor to cause the apparatus to receive an indication configuring the second device to transmit a first reference signal with a first peak to average power ratio and a second reference signal with a second peak to average power ratio that is greater than the first peak to average power ratio, where the second reference signal is for probing a nonlinear response, transmit, to a first device, the first reference signal and the second reference signal based on receiving the indication, receive signaling associated with a neural network model and one or more neural network weights corresponding to one or more transmission parameters, where the neural network model and the one or more neural network weights are based on a channel estimate from the first reference signal and the second reference signal, and communicate with the first device based on the received signaling.

Another apparatus for wireless communications at a second device is described. The apparatus may include means for receiving an indication configuring the second device to transmit a first reference signal with a first peak to average power ratio and a second reference signal with a second peak to average power ratio that is greater than the first peak to average power ratio, where the second reference signal is for probing a nonlinear response, means for transmitting, to a first device, the first reference signal and the second reference signal based on receiving the indication, means for receiving signaling associated with a neural network model and one or more neural network weights corresponding to one or more transmission parameters, where the neural network model and the one or more neural network weights are based on a channel estimate from the first reference signal and the second reference signal, and means for communicating with the first device based on the received signaling.

A non-transitory computer-readable medium storing code for wireless communications at a second device is described. The code may include instructions executable by a processor to receive an indication configuring the second device to transmit a first reference signal with a first peak to average power ratio and a second reference signal with a second peak to average power ratio that is greater than the first peak to average power ratio, where the second reference signal is for probing a nonlinear response, transmit, to a first device, the first reference signal and the second reference signal based on receiving the indication, receive signaling associated with a neural network model and one or more neural network weights corresponding to one or more transmission parameters, where the neural network model and the one or more neural network weights are based on a channel estimate from the first reference signal and the second reference signal, and communicate with the first device based on the received signaling.

Some examples of the method, apparatuses, and non-transitory computer-readable medium described herein may further include operations, features, means, or instructions for estimating a transmission encoding metric associated with the first reference signal and the second reference signal based on the received signaling, where communicating with the first device may be further based on the estimated transmission encoding metric.

In some examples of the method, apparatuses, and non-transitory computer-readable medium described herein, receiving the signaling includes receiving an indication of the transmission encoding metric, where estimating the transmission encoding metric may be based on the received indication.

In some examples of the method, apparatuses, and non-transitory computer-readable medium described herein, the neural network model and the one or more neural network weights correspond to a nonlinear response associated with transmissions at the second device and the transmission encoding metric includes a second neural network model and a second one or more neural network weights associated with encoding the transmissions at the second device based on the nonlinear response.

A method for wireless communications at a second device is described. The method may include receiving an indication configuring the second device to generate a reference signal for use in learning a nonlinear response of transmission components of the second device, capturing one or more samples of the reference signal generated at the second device based on receiving the indication, determining a neural network model and one or more neural network weights corresponding to one or more transmission parameters associated with the second device based on the one or more samples of the reference signal, estimating a transmission encoding metric and a reception decoding metric associated with the reference signal based on the neural network model and the one or more neural network weights, transmitting signaling associated with the neural network model and the one or more neural network weights based on the estimating, and communicating with a first device based on the transmission encoding metric.

An apparatus for wireless communications at a second device is described. The apparatus may include a processor, memory coupled with the processor, and instructions stored in the memory. The instructions may be executable by the processor to cause the apparatus to receive an indication configuring the second device to generate a reference signal for use in learning a nonlinear response of transmission components of the second device, capture one or more samples of the reference signal generated at the second device based on receiving the indication, determine a neural network model and one or more neural network weights corresponding to one or more transmission parameters associated with the second device based on the one or more samples of the reference signal, estimate a transmission encoding metric and a reception decoding metric associated with the reference signal based on the neural network model and the one or more neural network weights, transmit signaling associated with the neural network model and the one or more neural network weights based on the estimating, and communicate with a first device based on the transmission encoding metric.

Another apparatus for wireless communications at a second device is described. The apparatus may include means for receiving an indication configuring the second device to generate a reference signal for use in learning a nonlinear response of transmission components of the second device, means for capturing one or more samples of the reference signal generated at the second device based on receiving the indication, means for determining a neural network model and one or more neural network weights corresponding to one or more transmission parameters associated with the second device based on the one or more samples of the reference signal, means for estimating a transmission encoding metric and a reception decoding metric associated with the reference signal based on the neural network model and the one or more neural network weights, means for transmitting signaling associated with the neural network model and the one or more neural network weights based on the estimating, and means for communicating with a first device based on the transmission encoding metric.

A non-transitory computer-readable medium storing code for wireless communications at a second device is described. The code may include instructions executable by a processor to receive an indication configuring the second device to generate a reference signal for use in learning a nonlinear response of transmission components of the second device, capture one or more samples of the reference signal generated at the second device based on receiving the indication, determine a neural network model and one or more neural network weights corresponding to one or more transmission parameters associated with the second device based on the one or more samples of the reference signal, estimate a transmission encoding metric and a reception decoding metric associated with the reference signal based on the neural network model and the one or more neural network weights, transmit signaling associated with the neural network model and the one or more neural network weights based on the estimating, and communicate with a first device based on the transmission encoding metric.

In some examples of the method, apparatuses, and non-transitory computer-readable medium described herein, transmitting the signaling may include operations, features, means, or instructions for transmitting, to the first device, an indication of the reception decoding metric associated with the reference signal.

Some examples of the method, apparatuses, and non-transitory computer-readable medium described herein may further include operations, features, means, or instructions for receiving an indication configuring a periodicity of the signaling associated with the neural network model and the one or more neural network weights, where transmitting the signaling may be based on the configured periodicity.

In some examples of the method, apparatuses, and non-transitory computer-readable medium described herein, the neural network model and the one or more neural network weights correspond to a nonlinear response associated with transmissions at the second device, the reception decoding metric includes a second neural network model and a second one or more neural network weights associated with decoding transmissions received at the first device based on the nonlinear response, and the transmission encoding metric includes a third neural network model and a third one or more neural network weights associated with encoding the transmissions at the second device based on the nonlinear response.

A method for wireless communications at a first device is described. The method may include transmitting an indication configuring a second device to transmit a reference signal for use in learning a nonlinear response of transmission components of the second device, receiving the reference signal from the second device based on transmitting the indication, receiving signaling associated with a neural network model and one or more neural network weights corresponding to one or more transmission parameters, where the neural network model and the one or more neural network weights are based on the received reference signal, and communicating with the second device based on the received signaling.

An apparatus for wireless communications at a first device is described. The apparatus may include a processor, memory coupled with the processor, and instructions stored in the memory. The instructions may be executable by the processor to cause the apparatus to transmit an indication configuring a second device to transmit a reference signal for use in learning a nonlinear response of transmission components of the second device, receive the reference signal from the second device based on transmitting the indication, receive signaling associated with a neural network model and one or more neural network weights corresponding to one or more transmission parameters, where the neural network model and the one or more neural network weights are based on the received reference signal, and communicate with the second device based on the received signaling.

Another apparatus for wireless communications at a first device is described. The apparatus may include means for transmitting an indication configuring a second device to transmit a reference signal for use in learning a nonlinear response of transmission components of the second device, means for receiving the reference signal from the second device based on transmitting the indication, means for receiving signaling associated with a neural network model and one or more neural network weights corresponding to one or more transmission parameters, where the neural network model and the one or more neural network weights are based on the received reference signal, and means for communicating with the second device based on the received signaling.

A non-transitory computer-readable medium storing code for wireless communications at a first device is described. The code may include instructions executable by a processor to transmit an indication configuring a second device to transmit a reference signal for use in learning a nonlinear response of transmission components of the second device, receive the reference signal from the second device based on transmitting the indication, receive signaling associated with a neural network model and one or more neural network weights corresponding to one or more transmission parameters, where the neural network model and the one or more neural network weights are based on the received reference signal, and communicate with the second device based on the received signaling.

Some examples of the method, apparatuses, and non-transitory computer-readable medium described herein may further include operations, features, means, or instructions for estimating a reception decoding metric associated with the reference signal based on the received signaling, where communicating with the second device may be further based on the estimated reception decoding metric.

In some examples of the method, apparatuses, and non-transitory computer-readable medium described herein, receiving the signaling includes receiving an indication of the reception decoding metric and estimating the reception decoding metric may be based on the received indication.

Some examples of the method, apparatuses, and non-transitory computer-readable medium described herein may further include operations, features, means, or instructions for transmitting a grant scheduling a transmission including the signaling, where receiving the signaling may be based on the grant, where the grant includes an uplink grant in a downlink control information message, and where the scheduled transmission includes an uplink shared channel transmission.

DETAILED DESCRIPTION

Figure 1:
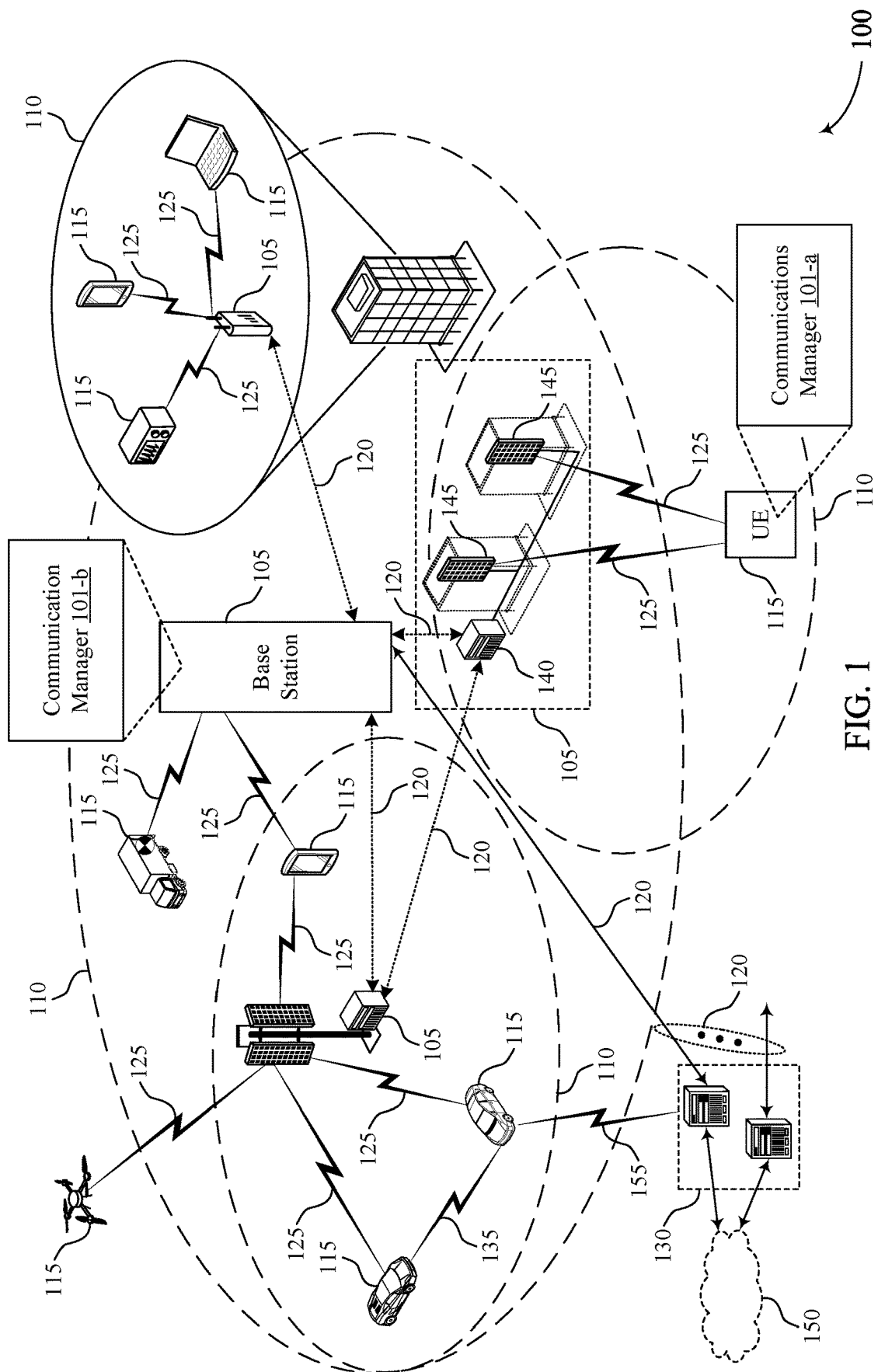
FIGS. 1 and 2 illustrate examples of a wireless communications system that supports distortion probing reference signals in accordance with one or more aspects of the present disclosure.

In wireless communications between transmitting devices and receiving devices (e.g., UEs and base stations), distortion of a transmission waveform sent from a transmitting device, such as signal clipping, may hinder a successful reception of the transmission waveform by the receiving device. Distortion of the transmission waveform may be caused by one or more factors, such as components of the transmitting device. For example, one or more power amplifiers of a transmitting device may cause distortion of the transmission waveform. In some examples, the amount of distortion may increase as power levels of the power amplifiers increase. In some examples, transmitting devices may mitigate the distortion caused by power amplifiers to the transmission waveform by keeping power levels of the power amplifiers below certain levels. This reduction of the power levels of the power amplifiers of the transmitting device may reduce the distortion of the transmission waveform. In some examples, a device which transmits signals with a lower peak to average power ratio (PAPR) may utilize transmission power more efficiently.

In some examples, one or more transmission components at a device (e.g. a power amplifier) may have a nonlinear response to an input signal. It may be beneficial to learn the nonlinear response of the transmission components, for example to improve power efficiency at the device.

In accordance with techniques disclosed herein, one or more devices may use a neural network model to learn a nonlinear response of transmission components at a transmitting device (e.g., a UE) based on a reference signal transmitted by the transmitting device. The reference signal may be configured as a waveform with a high PAPR and may be referred to as a distortion probing reference signal (DPRS). The transmitting device may generate the distortion probing reference signal using a scrambling sequence with a high PAPR compared to a PAPR of another reference signal (e.g., a demodulation reference signal (DMRS)). A base station may schedule the transmitting device to transmit the distortion probing reference signal, for example in a Radio Resource Control (RRC) message or a downlink control information (DCI) message. The distortion probing reference signal may include a set of contiguous symbols in a time domain, for example a set of orthogonal frequency division multiplexing (OFDM) symbols. In some examples, each transmitting antenna of the transmitting device may be allocated an orthogonal time and frequency resource for transmitting the distortion probing reference signal.

In a first implementation, a first device may use a neural network model to learn a nonlinear response of transmission components at a second device based on reference signals transmitted by the second device. The second device may transmit a first reference signal (e.g., a DMRS) and a second reference signal, where the second reference signal may be a distortion probing reference signal. The first reference signal may have a first PAPR and the second reference signal may have a second PAPR greater than the first PAPR. In some examples, the first device may use the first reference signal to estimate a channel (e.g., without the nonlinear response of transmission components at the second device) between the first device and the second device.

The first device may use one or more transmission parameters of the second device as inputs for a neural network model to learn the nonlinear response. For example, the transmission parameters may include the channel estimates from the first reference signal, one or more additional parameters based on the first and second reference signals, etc. Each input of the neural network model may be weighted. For example, the first device may determine one or more neural network weights associated with the one or more transmission parameters.

Once the first device learns the nonlinear response using the neural network model, the first device may use the nonlinear response to train additional neural network models which may be used to compensate for or mitigate the nonlinear response of transmission components. For example, a second neural network model and weights may be associated with encoding transmissions at the second device, and a third neural network model and weights may be associated with decoding transmissions received at the first device. The first device may estimate a transmission encoding metric, which may include the second neural network model and weights, and a reception decoding metric, which may include the third neural network model and weights. The first device may use the reception decoding metric to reliably decode transmissions from the second device when communicating with the second device.

The first device may transmit signaling to the second device, which the second device may use to compensate for the nonlinear response when encoding transmissions. In some examples, the signaling may include the transmission encoding metric, which the second device may use to reliably encode transmissions when communicating with the first device. Alternatively, the signaling may include the trained neural network model and weights to model the nonlinear response, which the second device may use to compensate for the nonlinear response (e.g., by estimating the transmission encoding metric).

In a second implementation, the second device may use a neural network model to learn the nonlinear response of its transmission components based on a generated reference signal. The second device may obtain (e.g., sniff, capture, etc.) one or more samples of a reference signal generated and transmitted at the second device, where the reference signal may be a distortion probing reference signal. The second device may use one or more transmission parameters of the second device as inputs for the neural network model to learn the nonlinear response. For example, the transmission parameters may include the samples of the reference signal. Each input of the neural network model may be weighted to reconstruct the captured samples. For example, the second device may determine one or more neural network weights associated with the one or more transmission parameters.

Once the second device learns the nonlinear response using the neural network model, the second device may use the nonlinear response to train additional neural network models which may be used to compensate for or mitigate the nonlinear response of transmission components. For example, a second neural network model and weights may be associated with decoding transmissions received at the first device, and a third neural network model and weights may be associated with encoding transmissions at the second device. The second device may estimate a reception decoding metric, which may include the second neural network model and weights, and a transmission encoding metric, which may include the third neural network model and weights. The second device may use the transmission encoding metric to reliably encode transmissions to the first device when communicating with the first device.

The second device may transmit signaling to the first device, which the first device may use to compensate for the nonlinear response when decoding transmissions. In some examples, the signaling may include the reception decoding metric, which the first device may use to reliably decode transmissions when communicating with the second device. Alternatively, the signaling may include the trained neural network model and weights to model the nonlinear response, which the first device may use to compensate for the nonlinear response (e.g., by estimating the reception decoding metric).

One or more aspects of the disclosure are initially described in the context of wireless communications systems. One or more aspects of the disclosure are further illustrated by and described with reference to process flows, apparatus diagrams, system diagrams, and flowcharts that relate to distortion probing reference signals.

FIG. 1 illustrates an example of a wireless communications system 100 that supports distortion probing reference signals in accordance with one or more aspects of the present disclosure. The wireless communications system 100 may include one or more base stations 105, one or more UEs 115, and a core network 130. In some examples, the wireless communications system 100 may be a Long Term Evolution (LTE) network, an LTE-Advanced (LTE-A) network, an LTE-A Pro network, or a New Radio (NR) network. In some examples, the wireless communications system 100 may support enhanced broadband communications, ultra-reliable (e.g., mission critical) communications, low latency communications, communications with low-cost and low-complexity devices, or any combination thereof.

The base stations 105 may be dispersed throughout a geographic area to form the wireless communications system 100 and may be devices in different forms or having different capabilities. The base stations 105 and the UEs 115 may wirelessly communicate via one or more communication links 125. Each base station 105 may provide a coverage area 110 over which the UEs 115 and the base station 105 may establish one or more communication links 125. The coverage area 110 may be an example of a geographic area over which a base station 105 and a UE 115 may support the communication of signals according to one or more radio access technologies.

The UEs 115 may be dispersed throughout a coverage area 110 of the wireless communications system 100, and each UE 115 may be stationary, or mobile, or both at different times. The UEs 115 may be devices in different forms or having different capabilities. Some example UEs 115 are illustrated in FIG. 1. The UEs 115 described herein may be able to communicate with various types of devices, such as other UEs 115, the base stations 105, or network equipment (e.g., core network nodes, relay devices, integrated access and backhaul (IAB) nodes, or other network equipment), as shown in FIG. 1.

The base stations 105 may communicate with the core network 130, or with one another, or both. For example, the base stations 105 may interface with the core network 130 through one or more backhaul links 120 (e.g., via an S1, N2, N3, or other interface). The base stations 105 may communicate with one another over the backhaul links 120 (e.g., via an X2, Xn, or other interface) either directly (e.g., directly between base stations 105), or indirectly (e.g., via core network 130), or both. In some examples, the backhaul links 120 may be or include one or more wireless links. In some examples, a UE 115 may communicate with the core network 130 through a communication link 155.

One or more of the base stations 105 described herein may include or may be referred to by a person having ordinary skill in the art as a base transceiver station, a radio base station, an access point, a radio transceiver, a NodeB, an eNodeB (eNB), a next-generation NodeB or a giga-NodeB (either of which may be referred to as a gNB), a Home NodeB, a Home eNodeB, or other suitable terminology.

A UE 115 may include or may be referred to as a mobile device, a wireless device, a remote device, a handheld device, or a subscriber device, or some other suitable terminology, where the "device" may also be referred to as a unit, a station, a terminal, or a client, among other examples. A UE 115 may also include or may be referred to as a personal electronic device such as a cellular phone, a personal digital assistant (PDA), a tablet computer, a laptop computer, or a personal computer. In some examples, a UE 115 may include or be referred to as a wireless local loop (WLL) station, an Internet of Things (IoT) device, an Internet of Everything (IoE) device, or a machine type communications (MTC) device, among other examples, which may be implemented in various objects such as appliances, or vehicles, meters, among other examples.

The UEs 115 described herein may be able to communicate with various types of devices, such as other UEs 115 that may sometimes act as relays as well as the base stations 105 and the network equipment including macro eNBs or gNBs, small cell eNBs or gNBs, or relay base stations, among other examples, as shown in FIG. 1.

The UEs 115 and the base stations 105 may wirelessly communicate with one another via one or more communication links 125 over one or more carriers. The term "carrier" may refer to a set of radio frequency spectrum resources having a defined physical layer structure for supporting the communication links 125. For example, a carrier used for a communication link 125 may include a portion of a radio frequency spectrum band (e.g., a bandwidth part (BWP)) that is operated according to one or more physical layer channels for a given radio access technology (e.g., LTE, LTE-A, LTE-A Pro, NR). Each physical layer channel may carry acquisition signaling (e.g., synchronization signals, system information), control signaling that coordinates operation for the carrier, user data, or other signaling. The wireless communications system 100 may support communication with a UE 115 using carrier aggregation or multi-carrier operation. A UE 115 may be configured with multiple downlink component carriers and one or more uplink component carriers according to a carrier aggregation configuration. Carrier aggregation may be used with both frequency division duplexing (FDD) and time division duplexing (TDD) component carriers.

In some examples (e.g., in a carrier aggregation configuration), a carrier may also have acquisition signaling or control signaling that coordinates operations for other carriers. A carrier may be associated with a frequency channel (e.g., an evolved universal mobile telecommunication system terrestrial radio access (E-UTRA) absolute radio frequency channel number (EARFCN)) and may be positioned according to a channel raster for discovery by the UEs 115. A carrier may be operated in a standalone mode where initial acquisition and connection may be conducted by the UEs 115 via the carrier, or the carrier may be operated in a non-standalone mode where a connection is anchored using a different carrier (e.g., of the same or a different radio access technology).

The communication links 125 shown in the wireless communications system 100 may include uplink transmissions from a UE 115 to a base station 105, or downlink transmissions from a base station 105 to a UE 115. Carriers may carry downlink or uplink communications (e.g., in an FDD mode) or may be configured to carry downlink and uplink communications (e.g., in a TDD mode).

A carrier may be associated with a particular bandwidth of the radio frequency spectrum, and in some examples the carrier bandwidth may be referred to as a "system bandwidth" of the carrier or the wireless communications system 100. For example, the carrier bandwidth may be one of a number of determined bandwidths for carriers of a particular radio access technology (e.g., 1.4, 3, 5, 10, 15, 20, 40, or 80 megahertz (MHz)). Devices of the wireless communications system 100 (e.g., the base stations 105, the UEs 115, or both) may have hardware configurations that support communications over a particular carrier bandwidth or may be configurable to support communications over one of a set of carrier bandwidths. In some examples, the wireless communications system 100 may include base stations 105 or UEs 115 that support simultaneous communications via carriers associated with multiple carrier bandwidths. In some examples, each served UE 115 may be configured for operating over portions (e.g., a sub-band, a BWP) or all of a carrier bandwidth.

Signal waveforms transmitted over a carrier may be made up of multiple subcarriers (e.g., using multi-carrier modulation (MCM) techniques such as OFDM or DFT-S-OFDM). In a system employing MCM techniques, a resource element may consist of one symbol period (e.g., a duration of one modulation symbol) and one subcarrier, where the symbol period and subcarrier spacing are inversely related. The number of bits carried by each resource element may depend on the modulation scheme (e.g., the order of the modulation scheme, the coding rate of the modulation scheme, or both). Thus, the more resource elements that a UE 115 receives and the higher the order of the modulation scheme, the higher the data rate may be for the UE 115. A wireless communications resource may refer to a combination of a radio frequency spectrum resource, a time resource, and a spatial resource (e.g., spatial layers or beams), and the use of multiple spatial layers may further increase the data rate or data integrity for communications with a UE 115.

The time intervals for the base stations 105 or the UEs 115 may be expressed in multiples of a basic time unit which may, for example, refer to a sampling period of $T_s=1/$ ($\Delta f_{max} \cdot N_f$) seconds, where $\Delta f_{max}$ may represent the maximum supported subcarrier spacing, and $N_f$ may represent the maximum supported discrete Fourier transform (DFT) size. Time intervals of a communications resource may be organized according to radio frames each having a specified duration (e.g., 10 milliseconds (ms)). Each radio frame may be identified by a system frame number (SFN) (e.g., ranging from 0 to 1023).

Each frame may include multiple consecutively numbered subframes or slots, and each subframe or slot may have the same duration. In some examples, a frame may be divided (e.g., in the time domain) into subframes, and each subframe may be further divided into a number of slots. Alternatively, each frame may include a variable number of slots, and the number of slots may depend on subcarrier spacing. Each slot may include a number of symbol periods (e.g., depending on the length of the cyclic prefix prepended to each symbol period). In some wireless communications systems 100, a slot may further be divided into multiple mini-slots containing one or more symbols. Excluding the cyclic prefix, each symbol period may contain one or more (e.g., $N_f$) sampling periods. The duration of a symbol period may depend on the subcarrier spacing or frequency band of operation.

A subframe, a slot, a mini-slot, or a symbol may be the smallest scheduling unit (e.g., in the time domain) of the wireless communications system 100 and may be referred to as a transmission time interval (TTI). In some examples, the TTI duration (e.g., the number of symbol periods in a TTI) may be variable. Additionally or alternatively, the smallest scheduling unit of the wireless communications system 100 may be dynamically selected (e.g., in bursts of shortened TTIs (sTTIs)).

Physical channels may be multiplexed on a carrier according to various techniques. A physical control channel and a physical data channel may be multiplexed on a downlink carrier, for example, using one or more of time division multiplexing (TDM) techniques, frequency division multiplexing (FDM) techniques, or hybrid TDM-FDM techniques. A control region (e.g., a control resource set (CORESET)) for a physical control channel may be defined by a number of symbol periods and may extend across the system bandwidth or a subset of the system bandwidth of the carrier. One or more control regions (e.g., CORESETs) may be configured for a set of the UEs 115. For example, one or more of the UEs 115 may monitor or search control regions for control information according to one or more search space sets, and each search space set may include one or multiple control channel candidates in one or more aggregation levels arranged in a cascaded manner. An aggregation level for a control channel candidate may refer to a number of control channel resources (e.g., control channel elements (CCEs)) associated with encoded information for a control information format having a given payload size. Search space sets may include common search space sets configured for sending control information to multiple UEs 115 and UE-specific search space sets for sending control information to a specific UE 115.

In some examples, a base station 105 may be movable and therefore provide communication coverage for a moving geographic coverage area 110. In some examples, different geographic coverage areas 110 associated with different technologies may overlap, but the different geographic coverage areas 110 may be supported by the same base station 105. In other examples, the overlapping geographic coverage areas 110 associated with different technologies may be supported by different base stations 105. The wireless communications system 100 may include, for example, a heterogeneous network in which different types of the base stations 105 provide coverage for various geographic coverage areas 110 using the same or different radio access technologies.

The wireless communications system 100 may be configured to support ultra-reliable communications or low-latency communications, or various combinations thereof. For example, the wireless communications system 100 may be configured to support ultra-reliable low-latency communications (URLLC) or mission critical communications. The UEs 115 may be designed to support ultra-reliable, low-latency, or critical functions (e.g., mission critical functions). Ultra-reliable communications may include private communication or group communication and may be supported by one or more mission critical services such as mission critical push-to-talk (MCPTT), mission critical video (MCVideo), or mission critical data (MCData). Support for mission critical functions may include prioritization of services, and mission critical services may be used for public safety or general commercial applications. The terms ultra-reliable, low-latency, mission critical, and ultra-reliable low-latency may be used interchangeably herein.

In some examples, a UE 115 may also be able to communicate directly with other UEs 115 over a device-to-device (D2D) communication link 135 (e.g., using a peer-to-peer (P2P) or D2D protocol). One or more UEs 115 utilizing D2D communications may be within the geographic coverage area 110 of a base station 105. Other UEs 115 in such a group may be outside the geographic coverage area 110 of a base station 105 or be otherwise unable to receive transmissions from a base station 105. In some examples, groups of the UEs 115 communicating via D2D communications may utilize a one-to-many (1:M) system in which each UE 115 transmits to every other UE 115 in the group. In some examples, a base station 105 facilitates the scheduling of resources for D2D communications. In other cases, D2D communications are carried out between the UEs 115 without the involvement of a base station 105.

The core network 130 may provide user authentication, access authorization, tracking, Internet Protocol (IP) connectivity, and other access, routing, or mobility functions. The core network 130 may be an evolved packet core (EPC) or 5G core (5GC), which may include at least one control plane entity that manages access and mobility (e.g., a mobility management entity (MME), an access and mobility management function (AMF)) and at least one user plane entity that routes packets or interconnects to external networks (e.g., a serving gateway (S-GW), a Packet Data Network (PDN) gateway (P-GW), or a user plane function (UPF)). The control plane entity may manage non-access stratum (NAS) functions such as mobility, authentication, and bearer management for the UEs 115 served by the base stations 105 associated with the core network 130. User IP packets may be transferred through the user plane entity, which may provide IP address allocation as well as other functions. The user plane entity may be connected to the network operators IP services 150. The operators IP services 150 may include access to the Internet, Intranet(s), an IP Multimedia Subsystem (IMS), or a Packet-Switched Streaming Service.

Some of the network devices, such as a base station 105, may include subcomponents such as an access network entity 140, which may be an example of an access node controller (ANC). Each access network entity 140 may communicate with the UEs 115 through one or more other access network transmission entities 145, which may be referred to as radio heads, smart radio heads, or transmission/reception points (TRPs). Each access network transmission entity 145 may include one or more antenna panels. In some configurations, various functions of each access network entity 140 or base station 105 may be distributed across various network devices (e.g., radio heads and ANCs) or consolidated into a single network device (e.g., a base station 105).

The wireless communications system 100 may operate using one or more frequency bands, typically in the range of 300 megahertz (MHz) to 300 gigahertz (GHz). Generally, the region from 300 MHz to 3 GHz is known as the ultra-high frequency (UHF) region or decimeter band because the wavelengths range from approximately one decimeter to one meter in length. The UHF waves may be blocked or redirected by buildings and environmental features, but the waves may penetrate structures sufficiently for a macro cell to provide service to the UEs 115 located indoors. The transmission of UHF waves may be associated with smaller antennas and shorter ranges (e.g., less than 100 kilometers) compared to transmission using the smaller frequencies and longer waves of the high frequency (HF) or very high frequency (VHF) portion of the spectrum below 300 MHz.

The electromagnetic spectrum is often subdivided, based on frequency/wavelength, into various classes, bands, channels, etc. In 5G NR two initial operating bands have been identified as frequency range designations FR1 (410 MHz-7.125 GHz) and FR2 (24.25 GHz-52.6 GHz). The frequencies between FR1 and FR2 are often referred to as mid-band frequencies. Although a portion of FR1 is greater than 6 GHz, FR1 is often referred to (interchangeably) as a "Sub-6 GHz" band in various documents and articles. A similar nomenclature issue sometimes occurs with regard to FR2, which is often referred to (interchangeably) as a "millimeter wave" band in documents and articles, despite being different from the extremely high frequency (EHF) band (30 GHz-300 GHz) which is identified by the International Telecommunications Union (ITU) as a "millimeter wave" band.

With the above aspects in mind, unless specifically stated otherwise, it should be understood that the term "sub-6 GHz" or the like if used herein may broadly represent frequencies that may be less than 6 GHz, may be within FR1, or may include mid-band frequencies. Further, unless specifically stated otherwise, it should be understood that the term "millimeter wave" or the like if used herein may broadly represent frequencies that may include mid-band frequencies, may be within FR2, or may be within the EHF band.

The wireless communications system 100 may utilize both licensed and unlicensed radio frequency spectrum bands. For example, the wireless communications system 100 may employ License Assisted Access (LAA), LTE-Unlicensed (LTE-U) radio access technology, or NR technology in an unlicensed band such as the 5 GHz industrial, scientific, and medical (ISM) band. When operating in unlicensed radio frequency spectrum bands, devices such as the base stations 105 and the UEs 115 may employ carrier sensing for collision detection and avoidance. In some examples, operations in unlicensed bands may be based on a carrier aggregation configuration in conjunction with component carriers operating in a licensed band (e.g., LAA). Operations in unlicensed spectrum may include downlink transmissions, uplink transmissions, P2P transmissions, or D2D transmissions, among other examples.

A base station 105 or a UE 115 may be equipped with multiple antennas, which may be used to employ techniques such as transmit diversity, receive diversity, multiple-input multiple-output (MIMO) communications, or beamforming. The antennas of a base station 105 or a UE 115 may be located within one or more antenna arrays or antenna panels, which may support MIMO operations or transmit or receive beamforming. For example, one or more base station antennas or antenna arrays may be co-located at an antenna assembly, such as an antenna tower. In some examples, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations. Additionally or alternatively, an antenna panel may support radio frequency beamforming for a signal transmitted via an antenna port.

The base stations 105 or the UEs 115 may use MIMO communications to exploit multipath signal propagation and increase the spectral efficiency by transmitting or receiving multiple signals via different spatial layers. Such techniques may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream and may carry bits associated with the same data stream (e.g., the same codeword) or different data streams (e.g., different codewords). Different spatial layers may be associated with different antenna ports used for channel measurement and reporting. MIMO techniques include single-user MIMO (SU-MIMO), where multiple spatial layers are transmitted to the same receiving device, and multiple-user MIMO (MU-MIMO), where multiple spatial layers are transmitted to multiple devices.

Beamforming, which may also be referred to as spatial filtering, directional transmission, or directional reception, is a signal processing technique that may be used at a transmitting device or a receiving device (e.g., a base station 105, a UE 115) to shape or steer an antenna beam (e.g., a transmit beam, a receive beam) along a spatial path between the transmitting device and the receiving device. Beamforming may be achieved by combining the signals communicated via antenna elements of an antenna array such that some signals propagating at particular orientations with respect to an antenna array experience constructive interference while others experience destructive interference. The adjustment of signals communicated via the antenna elements may include a transmitting device or a receiving device applying amplitude offsets, phase offsets, or both to signals carried via the antenna elements associated with the device. The adjustments associated with each of the antenna elements may be defined by a beamforming weight set associated with a particular orientation (e.g., with respect to the antenna array of the transmitting device or receiving device, or with respect to some other orientation).

A base station 105 or a UE 115 may use beam sweeping techniques as part of beam forming operations. For example, a base station 105 may use multiple antennas or antenna arrays (e.g., antenna panels) to conduct beamforming operations for directional communications with a UE 115. Some signals (e.g., synchronization signals, reference signals, beam selection signals, or other control signals) may be transmitted by a base station 105 multiple times in different directions. For example, the base station 105 may transmit a signal according to different beamforming weight sets associated with different directions of transmission. Transmissions in different beam directions may be used to identify (e.g., by a transmitting device, such as a base station 105, or by a receiving device, such as a UE 115) a beam direction for later transmission or reception by the base station 105.

Some signals, such as data signals associated with a particular receiving device, may be transmitted by a base station 105 in a single beam direction (e.g., a direction associated with the receiving device, such as a UE 115). In some examples, the beam direction associated with transmissions along a single beam direction may be determined based on a signal that was transmitted in one or more beam directions. For example, a UE 115 may receive one or more of the signals transmitted by the base station 105 in different directions and may report to the base station 105 an indication of the signal that the UE 115 received with a highest signal quality or an otherwise acceptable signal quality.

In some examples, transmissions by a device (e.g., by a base station 105 or a UE 115) may be performed using multiple beam directions, and the device may use a combination of digital precoding or radio frequency beamforming to generate a combined beam for transmission (e.g., from a base station 105 to a UE 115). The UE 115 may report feedback that indicates precoding weights for one or more beam directions, and the feedback may correspond to a configured number of beams across a system bandwidth or one or more sub-bands. The base station 105 may transmit a reference signal (e.g., a cell-specific reference signal (CRS), a channel state information reference signal (CSI-RS)), which may be precoded or unprecoded. The UE 115 may provide feedback for beam selection, which may be a precoding matrix indicator (PMI) or codebook-based feedback (e.g., a multi-panel type codebook, a linear combination type codebook, a port selection type codebook). Although these techniques are described with reference to signals transmitted in one or more directions by a base station 105, a UE 115 may employ similar techniques for transmitting signals multiple times in different directions (e.g., for identifying a beam direction for subsequent transmission or reception by the UE 115) or for transmitting a signal in a single direction (e.g., for transmitting data to a receiving device).

A receiving device (e.g., a UE 115) may try multiple receive configurations (e.g., directional listening) when receiving various signals from the base station 105, such as synchronization signals, reference signals, beam selection signals, or other control signals. For example, a receiving device may try multiple receive directions by receiving via different antenna subarrays, by processing received signals according to different antenna subarrays, by receiving according to different receive beamforming weight sets (e.g., different directional listening weight sets) applied to signals received at multiple antenna elements of an antenna array, or by processing received signals according to different receive beamforming weight sets applied to signals received at multiple antenna elements of an antenna array, any of which may be referred to as "listening" according to different receive configurations or receive directions. In some examples, a receiving device may use a single receive configuration to receive along a single beam direction (e.g., when receiving a data signal). The single receive configuration may be aligned in a beam direction determined based on listening according to different receive configuration directions (e.g., a beam direction determined to have a highest signal strength, highest signal-to-noise ratio (SNR), or otherwise acceptable signal quality based on listening according to multiple beam directions).

The wireless communications system 100 may be a packet-based network that operates according to a layered protocol stack. In the user plane, communications at the bearer or Packet Data Convergence Protocol (PDCP) layer may be IP-based. A Radio Link Control (RLC) layer may perform packet segmentation and reassembly to communicate over logical channels. A Medium Access Control (MAC) layer may perform priority handling and multiplexing of logical channels into transport channels. The MAC layer may also use error detection techniques, error correction techniques, or both to support retransmissions at the MAC layer to improve link efficiency. In the control plane, the RRC protocol layer may provide establishment, configuration, and maintenance of an RRC connection between a UE 115 and a base station 105 or a core network 130 supporting radio bearers for user plane data. At the physical layer, transport channels may be mapped to physical channels.

In accordance with techniques disclosed herein, a first device or a second device (e.g., a base station 105 or a UE 115) may use a neural network model to learn a nonlinear response of transmission components at the second device based on one or more reference signals transmitted by the second device. The reference signals may include a distortion probing reference signal generated using a high PAPR scrambling sequence. In a first implementation, the first device (e.g., a base station 105) may use the neural network model to learn the nonlinear response based on reference signals received from the second device. In a second implementation, the second device (e.g., a UE 115) may use the neural network model to learn the nonlinear response of its transmission components based on sampling reference signal generated at the second device. In the first and second implementations, the device which learns the nonlinear response may use the nonlinear response to train additional neural network models which may be used to compensate for or mitigate the nonlinear response. The device which learns the nonlinear response may transmit to the other device signaling associated with one or more of the neural network models, and each device may use the neural network models to reliably communicate. For example, the first device may use a reception decoding metric (e.g., a second neural network model and weights) to reliably decode transmissions from the second device when communicating with the second device, and the second device may use a transmission encoding metric (e.g., a third neural network model and weights) to reliably encode transmissions to the first device when communicating with the first device.

In various examples, a communication manager 101 may be included in a device to support distortion probing reference signals, which may or may not be associated with specific configurations or operations for transmission encoding or decoding. For example, a UE 115 may include a communications manager 101-a, or a base station may include a communications manager 110-b.

Figure 2:
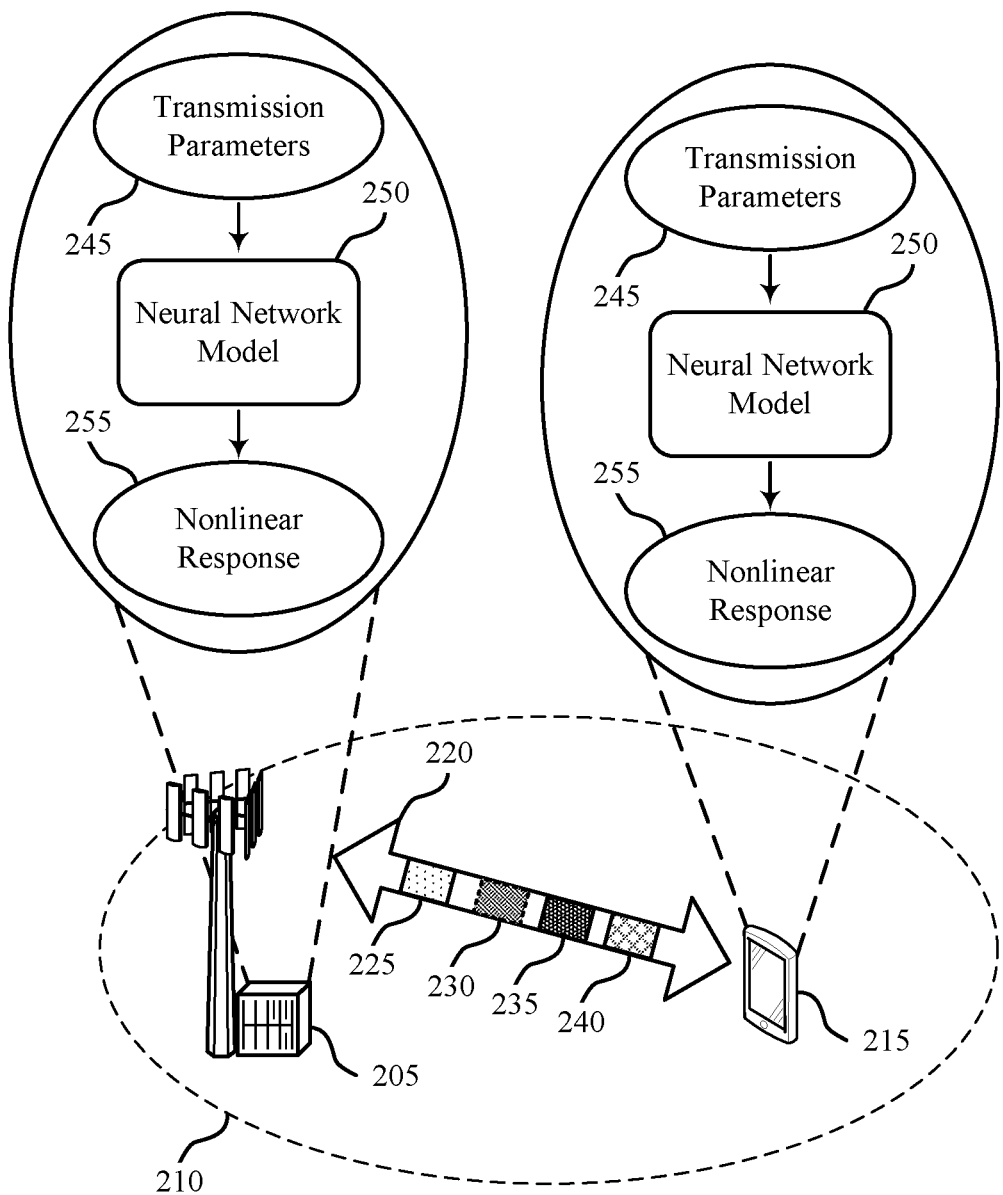

FIG. 2 illustrates an example of a wireless communications system 200 that supports distortion probing reference signals in accordance with one or more aspects of the present disclosure. In some examples, wireless communications system 200 may implement aspects of wireless communication system 100. For example, the wireless communications system 200 may include a base station 205 and a UE 215, which may be examples of the corresponding devices described with reference to FIG. 1. The base station 205 may provide a geographic coverage area 210. The base station 205 and the UE 215 may communicate over a channel 220. The wireless communications system 200 may include features for improved power efficiency, among other benefits.

One or more transmission components at the UE 215 may have a nonlinear response 255 to the transmissions from the UE 215. It may be beneficial to learn the nonlinear response 255 of the transmission components, for example to improve power efficiency at the UE 215. Accordingly, the base station 205 or the UE 215 may use a neural network model 250 to learn the nonlinear response 255 based on a reference signal 235 transmitted by the UE 215. The reference signal 235 may be configured as a waveform with a high PAPR and may be referred to as a distortion probing reference signal. In some examples, the base station 205 may schedule the UE 215 to transmit the reference signal 235. For example, the base station 205 may transmit an indication 225 in an RRC message or a DCI message.

In a first implementation, the base station 205 may use a neural network model 250 to learn the nonlinear response 255 of transmission components at the UE 215 based on reference signals transmitted by the UE 215. The UE 215 may transmit a DMRS 230 and a reference signal 235 (e.g., a distortion probing reference signal). The DMRS 230 may have a first PAPR and the reference signal 235 may have a second PAPR greater than the first PAPR. In some examples, the base station 205 may use the DMRS 230 to estimate the channel 220 (e.g., without the nonlinear response 255 of transmission components at the UE 215) between the base station 205 and the UE 215.

The base station 205 may use one or more transmission parameters 245 of the UE 215 as inputs for a neural network model 250 to learn the nonlinear response 255. For example, the transmission parameters 245 may include the channel estimates from the DMRS 230, one or more additional parameters based on the DMRS 230 and reference signal 235, etc. Each input of the neural network model 250 may be weighted. For example, the base station 205 may determine one or more neural network weights associated with the one or more transmission parameters 245. That is, based on the transmission parameters 245 and the neural network model 250, the base station 205 may learn or estimate the nonlinear response 255 of transmission components at the UE 215.

Once the base station 205 learns the nonlinear response 255 using the neural network model 250, the base station 205 may use the nonlinear response 255 to train additional neural network models which may be used to compensate for or mitigate the nonlinear response 255 of transmission components. For example, a second neural network model and weights may be associated with encoding transmissions at the UE 215, and a third neural network model and weights may be associated with decoding transmissions received at the base station 205. The base station 205 may estimate a transmission encoding metric, which may include the second neural network model and weights, and a reception decoding metric, which may include the third neural network model and weights. The base station 205 may use the reception decoding metric to reliably decode transmissions from the UE 215 when communicating with the UE 215.

The base station 205 may transmit signaling 240 to the UE 215, which the UE 215 may use to compensate for the nonlinear response 255 when encoding transmissions. In some examples, the signaling 240 may include the transmission encoding metric, which the UE 215 may use to reliably encode transmissions when communicating with the base station 205. Alternatively, the signaling 240 may include the neural network model 250 and weights for learning the nonlinear response 255, which the UE 215 may use to compensate for the nonlinear response 255 (e.g., by estimating the transmission encoding metric).

In a second implementation, the UE 215 (e.g., as opposed to the base station 205) may use a neural network model 250 to learn the nonlinear response 255 of its transmission components based on a generated reference signal 235. The UE 215 may obtain (e.g., sniff, capture, etc.) one or more samples of the reference signal 235 generated at the UE 215, where the reference signal 235 may be a distortion probing reference signal. The UE 215 may use one or more transmission parameters 245 of the UE 215 as inputs for the neural network model 250 to learn the nonlinear response 255. For example, the transmission parameters 245 may include the samples of the reference signal. The UE 215 may determine one or more neural network weights associated with the one or more transmission parameters 245. That is, based on the transmission parameters 245 and the neural network model 250, the UE 215 may learn or estimate the nonlinear response 255 of the transmission components at the UE 215.

Once the UE 215 learns the nonlinear response 255 using the neural network model 250, the UE 215 may use the nonlinear response 255 to train additional neural network models which may be used to compensate for or mitigate the nonlinear response 255. For example, a second neural network model and weights may be associated with decoding transmissions received at the base station 205, and a third neural network model and weights may be associated with encoding transmissions at the UE 215. The UE 215 may estimate a reception decoding metric, which may include the second neural network model and weights, and a transmission encoding metric, which may include the third neural network model and weights. The UE 215 may use the transmission encoding metric to reliably encode transmissions to the base station 205 when communicating with the base station 205.

The UE 215 may transmit signaling 240 to the base station 205, which the base station 205 may use to compensate for the nonlinear response 255 when decoding transmissions. In some examples, the base station 205 may (e.g., using the indication 225) configure a periodicity of the signaling 240. That is, the UE 215 may be configured to periodically determine the nonlinear response 255 and transmit the signaling 240 associated with the nonlinear response 255 to the base station 205.

In some examples, the signaling 240 may include the reception decoding metric, which the base station 205 may use to reliably decode transmissions when communicating with the UE 215. Alternatively, the signaling 240 may include the neural network 250 and weights to model the nonlinear response 255, which the base station 205 may use to compensate for the nonlinear response 255 (e.g., by estimating the reception decoding metric).

In either the first implementation or the second implementation, the base station 205 and the UE 215 may communicate via the channel 220 based on learning the nonlinear response 255. In some examples, the base station 205 may transmit a scheduling grant to the UE 215, for example in a DCI message. The scheduling grant may configure a transmission encoded based on the estimated transmission encoding metric. The base station 205 may then decode the transmission based on the estimated reception decoding metric. In some examples of the first implementation, the scheduling grant may be included in the signaling 240. In some examples, the scheduled transmission may be a physical uplink shared channel (PUSCH) transmission.

Although the implementations presented herein are directed to learning the nonlinear response 255 of transmission components at the UE 215, in some examples the roles of the UE 215 and the base station 205 may be reversed to enable the techniques described herein to be used for learning a nonlinear response 255 of transmission components at the base station 205. For example, the base station 205 may generate a reference signal 235, which may be a distortion probing reference signal. In a first example, the base station 205 may transmit the reference signal 235 to the UE 215, and the UE 215 may use the reference signal 235 as an input for a neural network model 250 to learn the nonlinear response 255 of the base station 205 transmission components. The UE 215 may transmit signaling 240 to the base station 205 based on learning the nonlinear response 255, and the UE 215 and the base station 205 may compensate for the nonlinear response 255 when communicating via the channel 220. In a second example, the base station 205 may capture samples of the generated reference signal 235, and the base station may use the captured samples as inputs for a neural network model 250 to learn the nonlinear response 255 of the base station 205 transmission components. The base station 205 may transmit signaling 240 to the UE 215 based on learning the nonlinear response 255, and the UE 215 and the base station 205 may compensate for the nonlinear response 255 when communicating via the channel 220.

Figure 3:
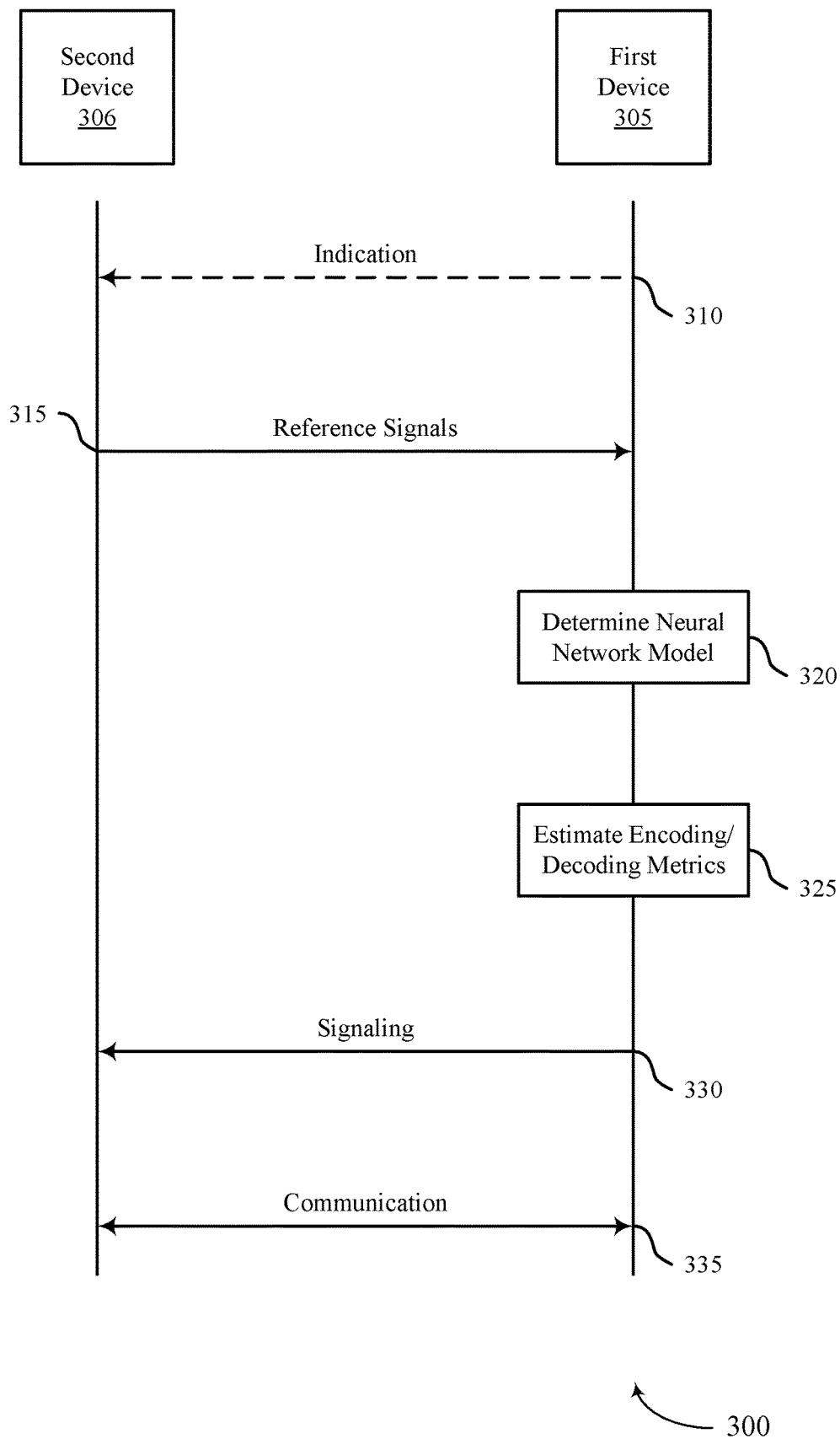
FIGS. 3 and 4 illustrate examples of process flows that support distortion probing reference signals in accordance with one or more aspects of the present disclosure.

FIG. 3 illustrates an example of a process flow 300 that supports distortion probing reference signals in accordance with one or more aspects of the present disclosure. In some examples, the process flow 300 may implement aspects of wireless communications systems 100 and 200. For example, the process flow 300 may include example operations associated with one or more of a first device 305 or a second device 306, each of which may be an example of a UE or a base station as described with reference to FIGS. 1 and 2. In the following description of the process flow 300, the operations between the first device 305 and the second device 306 may be performed in a different order than the example order shown, or the operations performed by the first device 305 and the second device 306 may be performed in different orders or at different times. Some operations may also be omitted from the process flow 300, and other operations may be added to the process flow 300. The operations performed by the first device 305 and the second device 306 may support improvements to device transmission operations and, in some examples, may promote improvements to the device communications efficiency, among other benefits.

In some examples, at 310 the first device 305 may transmit an indication to the second device 306 via a channel. The indication may configure the second device 306 to transmit a reference signal for use in learning a nonlinear response of transmission components of the second device 306. The first device 305 may transmit the indication in an RRC message, a DCI message, or both.

At 315, the second device 306 may transmit reference signals to the first device 305. A first reference signal (e.g., a DMRS) may have a first PAPR and a second reference signal (e.g., a distortion probing reference signal) may have a second PAPR greater than the first PAPR. In some examples, the second device 306 may transmit the second reference signal based on the indication from the first device 305. In some examples, the first device 305 may use the first reference signal to estimate a channel (e.g., without a nonlinear response of transmission components at the second device 306) between the first device 305 and the second device 306.

At 320, the first device 305 may determine a neural network model and one or more neural network weights to learn the nonlinear response of transmission components at the second device 306. The first device 305 may determine the neural network model and weights associated with one or more transmission parameters based on the reference signals. For example, the transmission parameters may include the channel estimates from the reference signals, one or more additional parameters based on the reference signals, etc. In some examples, the neural network model may be trained based on collected data or simulated data.

Once the first device 305 learns the nonlinear response using the neural network model, the first device 305 may use the nonlinear response to train additional neural network models which may be used to compensate for or mitigate the nonlinear response of transmission components at the second device 306. For example, a second neural network model and weights may be associated with encoding transmissions at the second device 306, and a third neural network model and weights may be associated with decoding transmissions received at the first device 305.

At 325, the first device 305 may estimate a transmission encoding metric, which may include the second neural network model and weights, and a reception decoding metric, which may include the third neural network model and weights. The first device 305 may use the reception decoding metric to reliably decode transmissions from the second device 306 when communicating with the second device 306.

At 330, the first device 305 may transmit signaling to the second device 306, which the second device 306 may use to compensate for the nonlinear response when encoding transmissions. In some examples, the signaling may include the transmission encoding metric, which the second device 306 may use to reliably encode transmissions when communicating with the first device 305. Alternatively, the signaling may include the neural network model and weights to model the nonlinear response, which the second device 306 may use to compensate for the nonlinear response (e.g., by estimating the transmission encoding metric).

In some examples, the signaling may include a grant scheduling a transmission from the second device 306. The grant may indicate the second device 306 is encode the transmission based on the transmission encoding metric. In some examples, the first device 305 may transmit the grant (e.g., an uplink grant) in a DCI message.

At 335, the first device 305 and the second device 306 may communicate via the channel. In some examples, the first device 305 and the second device 306 may communicate based on the channel estimate determined from the first reference signal (e.g., the DMRS). In some examples, the communication may include the transmission scheduled by the grant in the signaling. The second device 306 may encode the transmission based on the transmission encoding metric, and the first device 305 may decode the transmission based on the reception decoding metric. In some examples, the scheduled transmission may include a PUSCH transmission.

Figure 4:
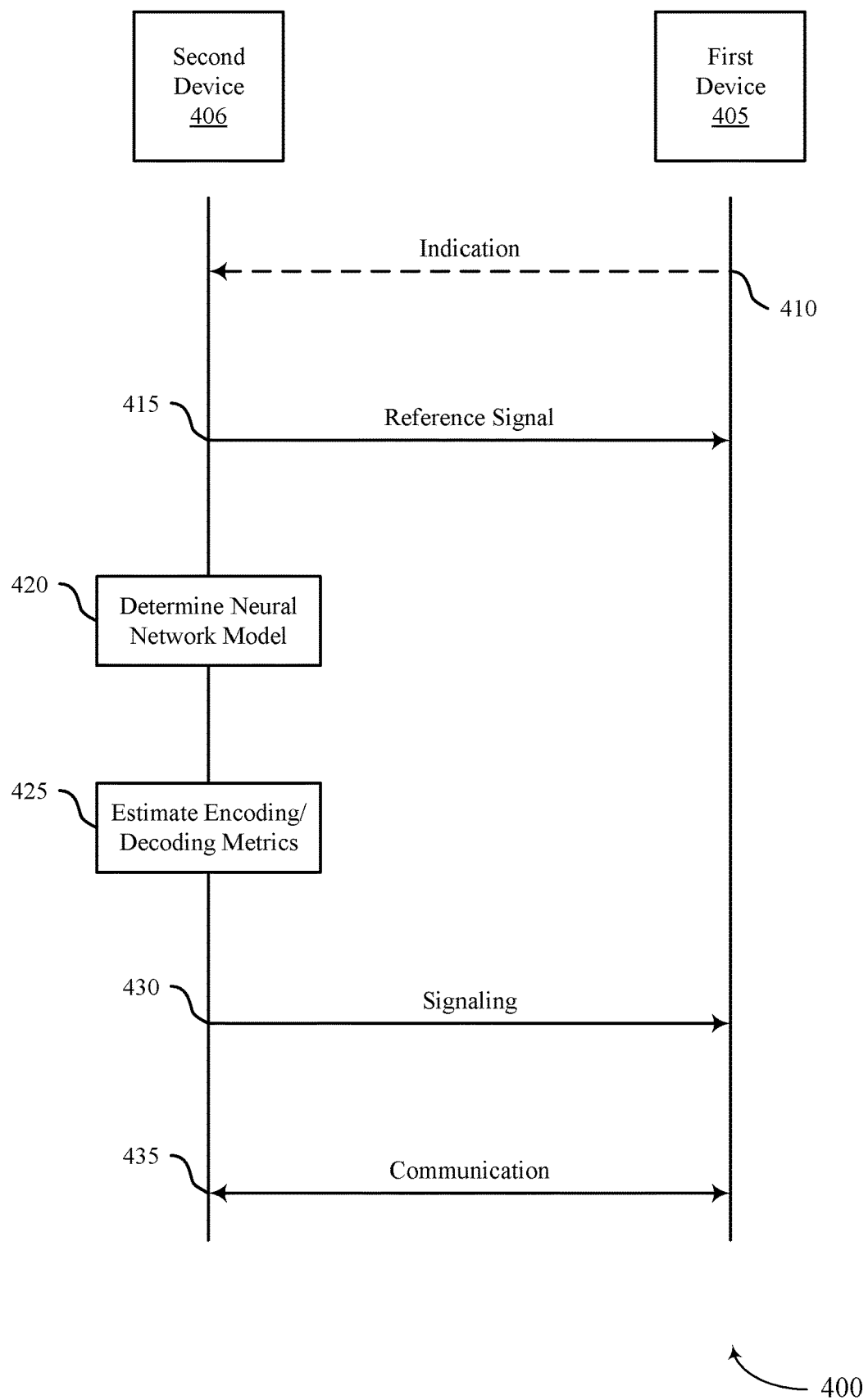

FIG. 4 illustrates an example of a process flow 400 that supports distortion probing reference signals in accordance with one or more aspects of the present disclosure. In some examples, the process flow 400 may implement aspects of wireless communications systems 100 and 200. For example, the process flow 400 may include example operations associated with one or more of a first device 405 or a second device 406, each of which may be examples of a UE or a base station as described with reference to FIGS. 1 and 2. In the following description of the process flow 400, the operations between the first device 405 and the second device 406 may be performed in a different order than the example order shown, or the operations performed by the first device 405 and the second device 406 may be performed in different orders or at different times. Some operations may also be omitted from the process flow 400, and other operations may be added to the process flow 400. The operations performed by the first device 405 and the second device 406 may support improvements to device transmission operations and, in some examples, may promote improvements to the device communications efficiency, among other benefits.

In some examples, at 410 the first device 405 may transmit an indication to the second device 406 via a channel. The indication may configure the second device 406 to transmit a reference signal for use in learning a nonlinear response of transmission components of the second device 406. The first device 405 may transmit the indication in an RRC message, a DCI message, or both. In some examples, the indication may configure a periodicity at the second device 406 for learning the nonlinear response and transmitting information associated with the nonlinear response to the first device 405.

At 415, the second device 406 may generate and transmit a reference signal to the first device 405. The generated reference signal may be configured as a waveform with a high PAPR and may be referred to as a distortion probing reference signal. The second device 406 may obtain (e.g., sniff, capture, etc.) one or more samples of the generated reference signal. In some examples, the second device 406 may transmit the reference signal based on the indication from the first device 405. In some examples, the second device 406 may transmit an additional reference signal (e.g., a DMRS), which the first device 405 may use to estimate the channel (e.g., without a nonlinear response of transmission components at the second device 406) between the first device 405 and the second device 406.

At 420, the second device 406 may determine a neural network model and one or more neural network weights to learn the nonlinear response of transmission components at the second device 406. The second device 406 may determine the neural network model and weights associated with one or more transmission parameters based on the generated reference signal. For example, the transmission parameters may include the captured samples of the generated reference signal. In some examples, the neural network model may be trained based on collected data or simulated data.

Once the second device 406 learns the nonlinear response using the neural network model, the second device 406 may use the nonlinear response to train additional neural network models which may be used to compensate for or mitigate the nonlinear response of transmission components at the second device 406. For example, a second neural network model and weights may be associated with decoding transmissions received at the first device 405, and a third neural network model and weights may be associated with encoding transmissions at the second device 406.

At 425, the second device 406 may estimate a reception decoding metric, which may include the second neural network model and weights, and a transmission encoding metric, which may include the third neural network model and weights. The second device 406 may use the transmission encoding metric to reliably encode transmissions to the first device 405 when communicating with the first device 405.

At 430, the second device 406 may transmit signaling to the first device 405, which the first device may use to compensate for the nonlinear response when decoding transmissions from the second device 406. In some examples, the second device 406 may transmit the signaling based on the periodicity indication from the first device 405. In some examples, the signaling may include the reception decoding metric, which the first device 405 may use to reliably decode transmissions when communicating with the second device 406. Alternatively, the signaling may include the neural network model and weights to model the nonlinear response, which the first device 405 may use to compensate for the nonlinear response (e.g., by estimating the reception decoding metric).

At 435, the first device 405 and the second device 406 may communicate via the channel. In some examples, the first device 405 and the second device 406 may communicate based on the channel estimate determined from the additional reference signal (e.g., the DMRS). In some examples, the first device 405 may transmit a grant scheduling a transmission from the second device 406. The grant may indicate the second device 406 is encode the transmission based on the transmission encoding metric. In some examples, the first device 405 may transmit the grant (e.g., an uplink grant) in a DCI message.

In some examples, the communication may include the transmission scheduled by the grant. The second device 406 may encode the transmission based on the transmission encoding metric, and the first device 405 may decode the transmission based on the reception decoding metric. In some examples, the scheduled transmission may include a PUSCH transmission.

Figure 5:
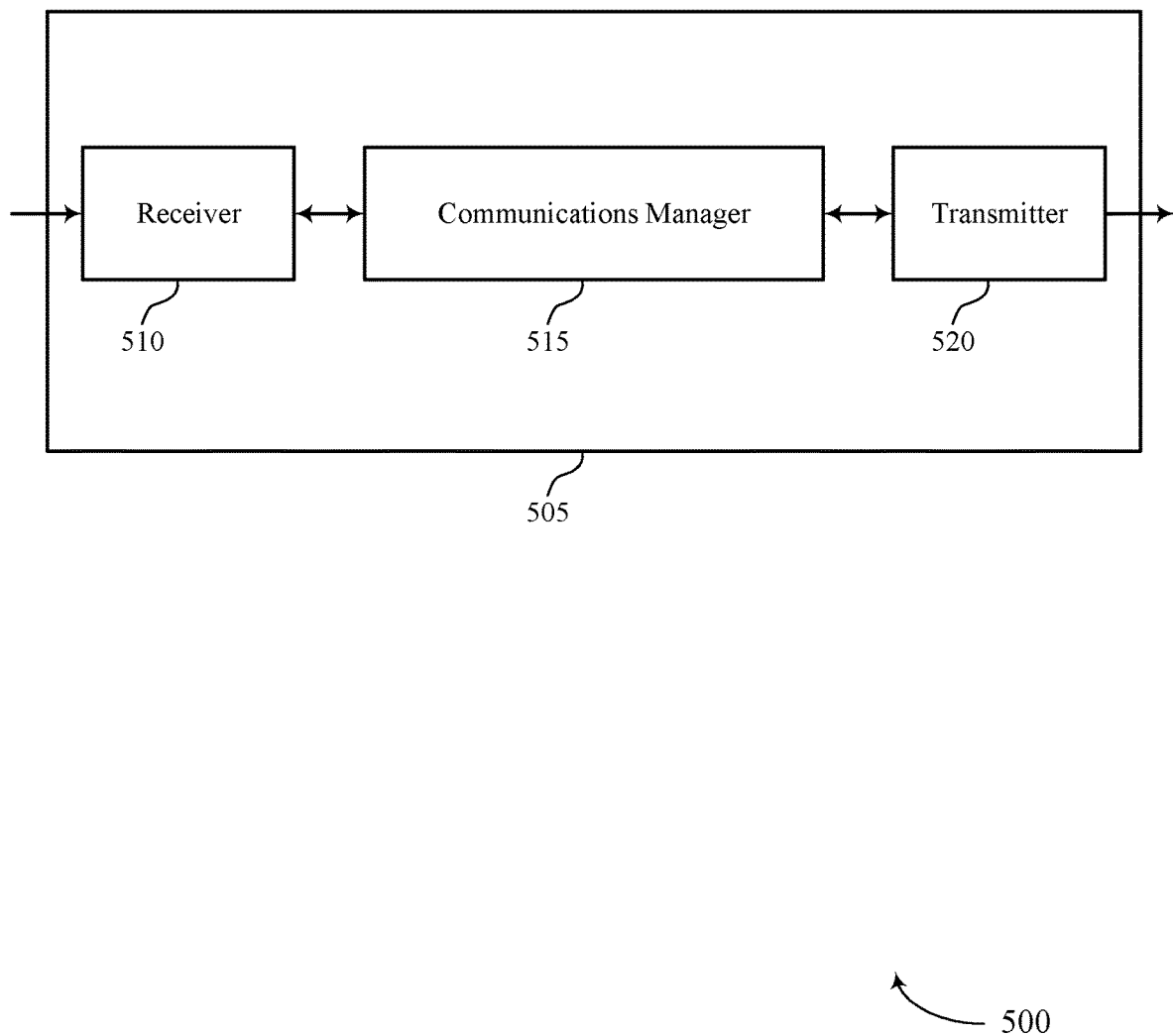
FIGS. 5 and 6 show block diagrams of devices that support distortion probing reference signals in accordance with one or more aspects of the present disclosure.

FIG. 5 shows a block diagram 500 of a device 505 that supports distortion probing reference signals in accordance with one or more aspects of the present disclosure. The device 505 may be an example of aspects of a second device such as a UE 115 as described herein. The device 505 may include a receiver 510, a communications manager 515, and a transmitter 520. The device 505 may also include a processor. Each of these components may be in communication with one another (e.g., via one or more buses).

The receiver 510 may receive information such as packets, user data, or control information associated with various information channels (e.g., control channels, data channels, and information related to distortion probing reference signals, etc.). Information may be passed on to other components of the device 505. The receiver 510 may be an example of aspects of the transceiver 820 described with reference to FIG. 8. The receiver 510 may utilize a single antenna or a set of antennas.

In some examples, the communications manager 515 may receive an indication configuring the second device to transmit a first reference signal with a first peak to average power ratio and a second reference signal with a second peak to average power ratio that is greater than the first peak to average power ratio, transmit, to a first device, the first reference signal and the second reference signal based on receiving the indication, receive signaling associated with a neural network model and one or more neural network weights corresponding to one or more transmission parameters, where the neural network model and the neural network weights are based on the first reference signal and the second reference signal, and communicate with the first device based on the received signaling.

In some examples, the communications manager 515 may receive an indication configuring the second device to generate a reference signal, capture one or more samples of the reference signal generated at the second device based on receiving the indication, determine a neural network model and one or more neural network weights corresponding to one or more transmission parameters associated with the second device based on the samples of the reference signal, estimate a transmission encoding metric and a reception decoding metric associated with the reference signal based on the neural network model and the neural network weights, transmit signaling associated with the neural network model and the neural network weights based on the estimating, and communicate with a first device based on the transmission encoding metric.

The communications manager 515 as described herein may be implemented to realize one or more potential improvements. One implementation may allow the device 505 to save power by communicating with a first device (e.g., a base station 105 or a UE 115 as shown in FIG. 1) more efficiently. For example, the device 505 may efficiently communicate with the first device based on learning the nonlinear response of transmission components of the device 505, as the device 505 may be able to reduce PAPR or otherwise compensate for the nonlinear response. The communications manager 515 may be an example of aspects of the communications manager 810 described herein.

The communications manager 515, or its sub-components, may be implemented in hardware, code (e.g., software or firmware) executed by a processor, or any combination thereof. If implemented in code executed by a processor, the functions of the communications manager 515, or its sub-components may be executed by a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described in the present disclosure.

The communications manager 515 may be an example of means for performing various aspects of managing distortion probing reference signals as described herein. The communications manager 515, or its sub-components, may be implemented in hardware (e.g., in communications management circuitry). The circuitry may comprise of processor, DSP, an ASIC, an FPGA or other programmable logic device, discrete gate or transistor logic, discrete hardware components, or any combination thereof designed to perform the functions described in the present disclosure.

In another implementation, the communications manager 515, or its sub-components, may be implemented in code (e.g., as communications management software or firmware) executed by a processor, or any combination thereof. If implemented in code executed by a processor, the functions of the communications manager 515, or its sub-components may be executed by a general-purpose processor, a DSP, an ASIC, a FPGA, or other programmable logic device In some examples, the communication manager 515 may be configured to perform various operations (e.g., receiving, determining, estimating, transmitting, communicating) using or otherwise in cooperation with the receiver 510, the transmitter 520, or both.

The communications manager 515, or its sub-components, may be physically located at various positions, including being distributed such that portions of functions are implemented at different physical locations by one or more physical components. In some examples, the communications manager 515, or its sub-components, may be a separate and distinct component in accordance with various aspects of the present disclosure. In some examples, the communications manager 515, or its sub-components, may be combined with one or more other hardware components, including but not limited to an input/output (I/O) component, a transceiver, a network server, another computing device, one or more other components described in the present disclosure, or a combination thereof in accordance with various aspects of the present disclosure.

The transmitter 520 may transmit signals generated by other components of the device 505. In some examples, the transmitter 520 may be collocated with a receiver 510 in a transceiver module. For example, the transmitter 520 may be an example of aspects of the transceiver 820 described with reference to FIG. 8. The transmitter 520 may utilize a single antenna or a set of antennas.

Figure 6:
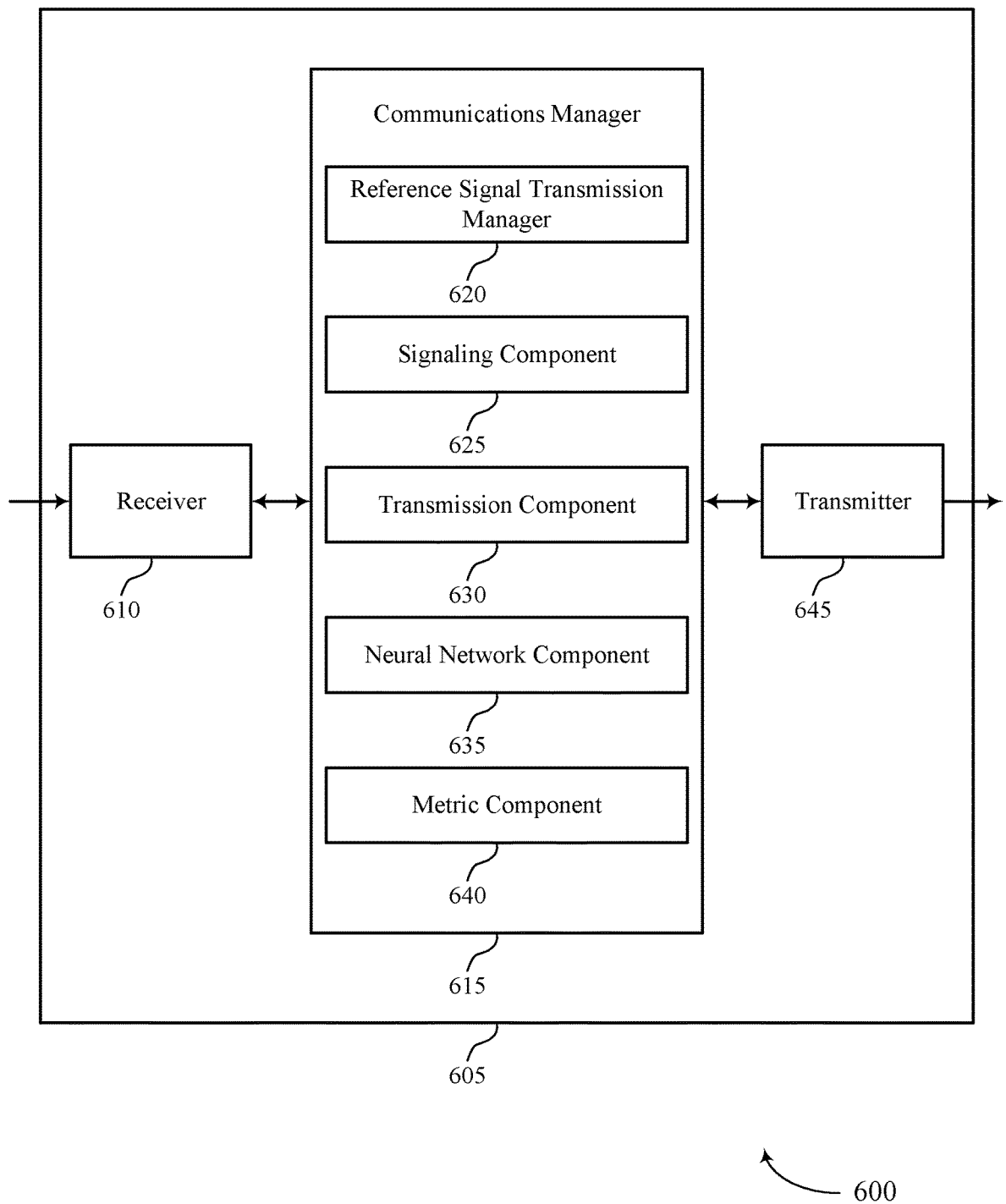

FIG. 6 shows a block diagram 600 of a device 605 that supports distortion probing reference signals in accordance with one or more aspects of the present disclosure. The device 605 may be an example of aspects of a device 505, or a second device such as a UE 115 as described herein. The device 605 may include a receiver 610, a communications manager 615, and a transmitter 645. The device 605 may also include a processor. Each of these components may be in communication with one another (e.g., via one or more buses).

The receiver 610 may receive information such as packets, user data, or control information associated with various information channels (e.g., control channels, data channels, and information related to distortion probing reference signals, etc.). Information may be passed on to other components of the device 605. The receiver 610 may be an example of aspects of the transceiver 820 described with reference to FIG. 8. The receiver 610 may utilize a single antenna or a set of antennas.

The communications manager 615 may be an example of aspects of the communications manager 515 as described herein. The communications manager 615 may include a reference signal transmission manager 620, a signaling component 625, a transmission component 630, a neural network component 635, and a metric component 640. The communications manager 615 may be an example of aspects of the communications manager 810 described herein.

In some examples, the reference signal transmission manager 620 may receive an indication configuring the second device to transmit a first reference signal with a first peak to average power ratio and a second reference signal with a second peak to average power ratio that is greater than the first peak to average power ratio and transmit, to a first device, the first reference signal and the second reference signal based on receiving the indication. The signaling component 625 may receive signaling associated with a neural network model and one or more neural network weights corresponding to one or more transmission parameters, where the neural network model and the neural network weights are based on the first reference signal and the second reference signal. The transmission component 630 may communicate with the first device based on the received signaling.

In some examples, the reference signal transmission manager 620 may receive an indication configuring the second device to generate a reference signal and capture one or more samples of the reference signal generated at the second device based on receiving the indication. The neural network component 635 may determine a neural network model and one or more neural network weights corresponding to one or more transmission parameters associated with the second device based on the samples of the reference signal. The metric component 640 may estimate a transmission encoding metric and a reception decoding metric associated with the reference signal based on the neural network model and the neural network weights. The signaling component 625 may transmit signaling associated with the neural network model and the neural network weights based on the estimating. The transmission component 630 may communicate with a first device based on the transmission encoding metric.

The transmitter 645 may transmit signals generated by other components of the device 605. In some examples, the transmitter 645 may be collocated with a receiver 610 in a transceiver module. For example, the transmitter 645 may be an example of aspects of the transceiver 820 described with reference to FIG. 8. The transmitter 645 may utilize a single antenna or a set of antennas.

Figure 7:
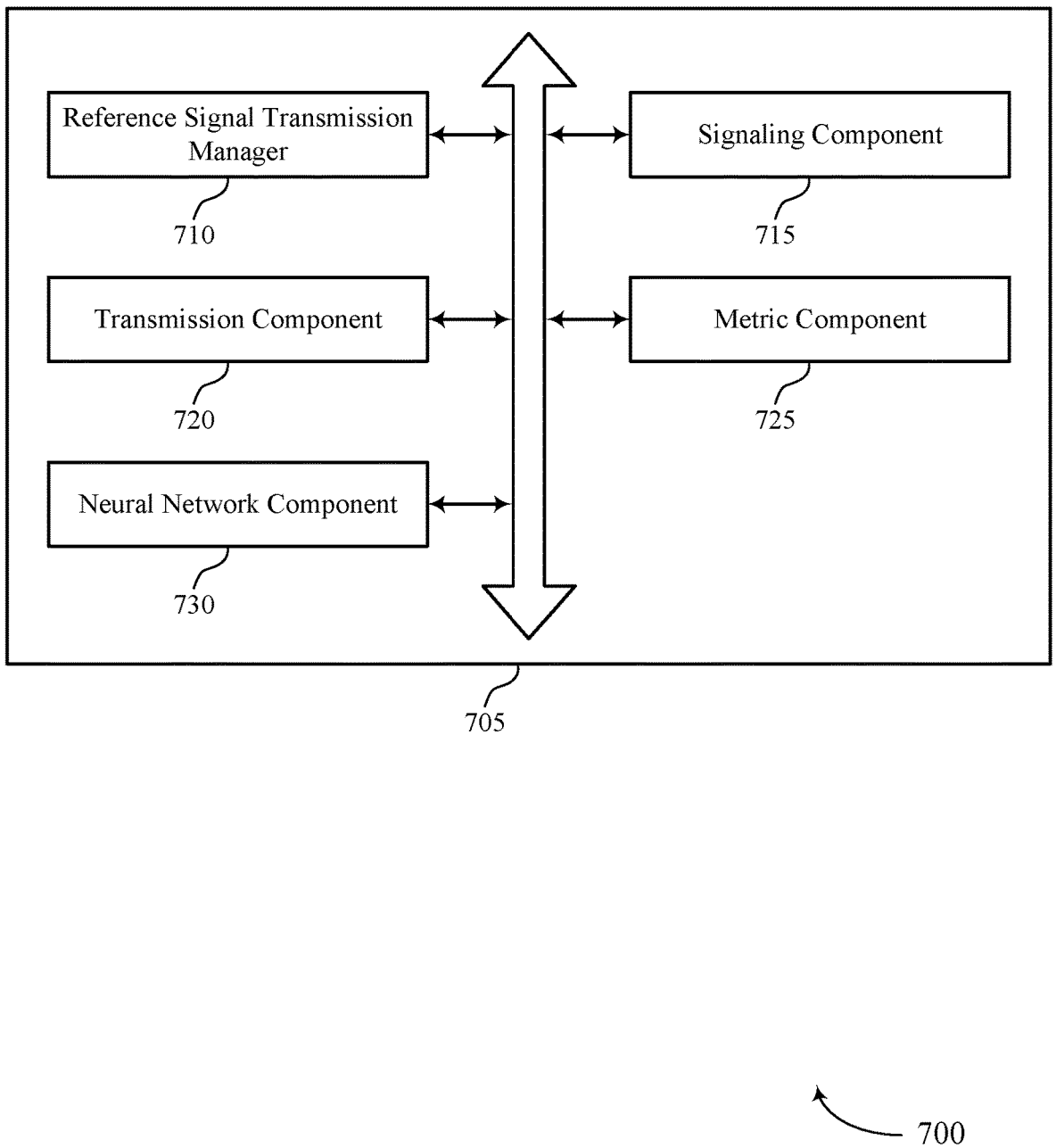
FIG. 7 shows a block diagram of a communications manager that supports distortion probing reference signals in accordance with one or more aspects of the present disclosure.

FIG. 7 shows a block diagram 700 of a communications manager 705 that supports distortion probing reference signals in accordance with one or more aspects of the present disclosure. The communications manager 705 may be an example of aspects of a communications manager 515, a communications manager 615, or a communications manager 810 described herein. The communications manager 705 may include a reference signal transmission manager 710, a signaling component 715, a transmission component 720, a metric component 725, and a neural network component 730. Each of these modules may communicate, directly or indirectly, with one another (e.g., via one or more buses).

In some examples, the reference signal transmission manager 710 may receive an indication configuring the second device to transmit a first reference signal with a first peak to average power ratio and a second reference signal with a second peak to average power ratio that is greater than the first peak to average power ratio and transmit, to a first device, the first reference signal and the second reference signal based on receiving the indication. In some examples, the indication includes a radio resource control message, a downlink control information message, or both. In some cases, the first reference signal includes a demodulation reference signal. In some cases, the second reference signal includes a set of contiguous symbols in a time domain.

In some examples, the signaling component 715 may receive signaling associated with a neural network model and one or more neural network weights corresponding to one or more transmission parameters, where the neural network model and the neural network weights are based on the first reference signal and the second reference signal. In some examples, the signaling component 715 may receive an indication of the transmission encoding metric, where estimating the transmission encoding metric is based on the received indication. In some cases, the neural network model and the neural network weights correspond to a nonlinear response associated with transmissions at the second device.

In some examples, the signaling component 715 may receive a grant scheduling a transmission that is encoded based on a transmission encoding metric associated with the first reference signal and the second reference signal, where communicating with the first device includes transmitting the scheduled transmission. In some cases, the grant includes an uplink grant in a downlink control information message. In some cases, the scheduled transmission includes an uplink shared channel transmission.

The transmission component 720 may communicate with the first device based on the received signaling.

In some examples, the metric component 725 may estimate a transmission encoding metric associated with the first reference signal and the second reference signal based on the received signaling, where communicating with the first device is further based on the estimated transmission encoding metric. In some cases, the transmission encoding metric includes a second neural network model and a second one or more neural network weights associated with encoding the transmissions at the second device based on the nonlinear response.

In some examples, the reference signal transmission manager 710 may receive an indication configuring the second device to generate a reference signal and capture one or more samples of the reference signal generated at the second device based on receiving the indication. In some examples, the indication includes a radio resource control message, a downlink control information message, or both. In some cases, the reference signal includes a set of contiguous symbols in a time domain.

In some examples, the neural network component 730 may determine a neural network model and one or more neural network weights corresponding to one or more transmission parameters associated with the second device based on the samples of the reference signal.

In some examples, the metric component 725 may estimate a transmission encoding metric and a reception decoding metric associated with the reference signal based on the neural network model and the neural network weights. In some cases, the reception decoding metric includes a second neural network model and a second one or more neural network weights associated with decoding transmissions received at the first device based on the nonlinear response. In some cases, the transmission encoding metric includes a third neural network model and a third one or more neural network weights with encoding the transmissions at the second device based on the nonlinear response.

In some examples, the signaling component 715 may transmit signaling associated with the neural network model and the neural network weights based on the estimating. In some examples, the signaling component 715 may transmit, to the first device, an indication of the reception decoding metric associated with the reference signal.

In some examples, the signaling component 715 may receive an indication configuring a periodicity of the signaling associated with the neural network model and the neural network weights, where transmitting the signaling is based on the configured periodicity.

In some examples, the signaling component 715 may receive a grant scheduling a transmission including the signaling associated with the neural network model and the neural network weights, where transmitting the signaling is based on the grant. In some cases, the grant includes an uplink grant in a downlink control information message. In some cases, the scheduled transmission includes an uplink shared channel transmission.

In some cases, the neural network model and the neural network weights correspond to a nonlinear response associated with transmissions at the second device.

In some examples, the transmission component 720 may communicate with a first device based on the transmission encoding metric.

Figure 8:
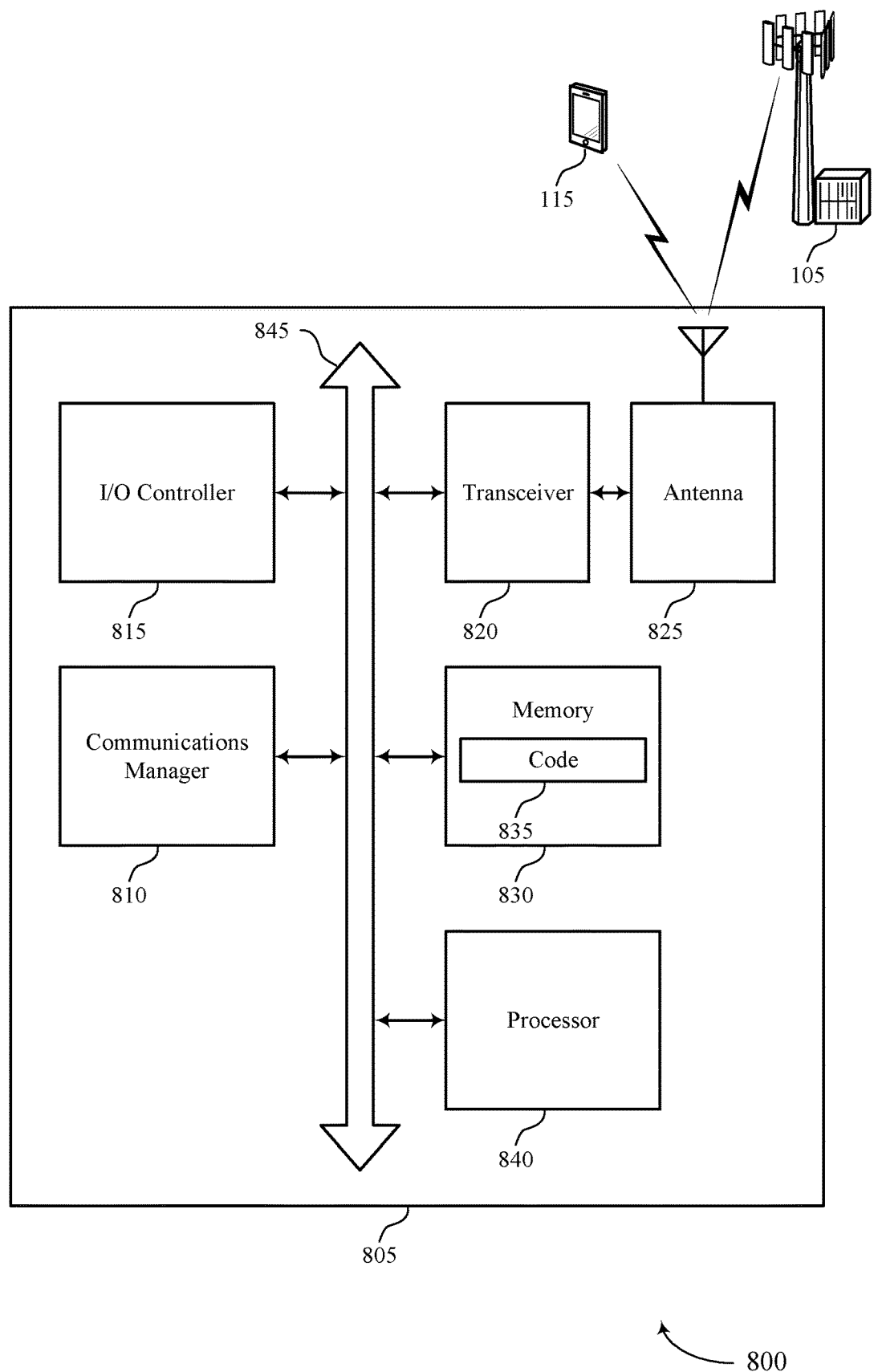
FIG. 8 shows a diagram of a system including a device that supports distortion probing reference signals in accordance with one or more aspects of the present disclosure.

FIG. 8 shows a diagram of a system 800 including a device 805 that supports distortion probing reference signals in accordance with one or more aspects of the present disclosure. The device 805 may be an example of or include the components of device 505, device 605, or a second device such as a UE 115 as described herein. The device 805 may include components for bi-directional voice and data communications including components for transmitting and receiving communications, including a communications manager 810, an I/O controller 815, a transceiver 820, an antenna 825, memory 830, and a processor 840. These components may be in electronic communication via one or more buses (e.g., bus 845).

In some examples, the communications manager 810 may receive an indication configuring the second device to transmit a first reference signal with a first peak to average power ratio and a second reference signal with a second peak to average power ratio that is greater than the first peak to average power ratio, transmit, to a first device, the first reference signal and the second reference signal based on receiving the indication, receive signaling associated with a neural network model and one or more neural network weights corresponding to one or more transmission parameters, where the neural network model and the neural network weights are based on the first reference signal and the second reference signal, and communicate with the first device based on the received signaling.

In some examples, the communications manager 810 may receive an indication configuring the second device to generate a reference signal, capture one or more samples of the reference signal generated at the second device based on receiving the indication, determine a neural network model and one or more neural network weights corresponding to one or more transmission parameters associated with the second device based on the samples of the reference signal, estimate a transmission encoding metric and a reception decoding metric associated with the reference signal based on the neural network model and the neural network weights, transmit signaling associated with the neural network model and the neural network weights based on the estimating, and communicate with a first device based on the transmission encoding metric.

The I/O controller 815 may manage input and output signals for the device 805. The I/O controller 815 may also manage peripherals not integrated into the device 805. In some cases, the I/O controller 815 may represent a physical connection or port to an external peripheral. In some cases, the I/O controller 815 may utilize an operating system such as iOS®, ANDROID®, MS-DOS®, MS-WINDOWS®, OS/2®, UNIX®, LINUX®, or another known operating system. In other cases, the I/O controller 815 may represent or interact with a modem, a keyboard, a mouse, a touchscreen, or a similar device. In some cases, the I/O controller 815 may be implemented as part of a processor. In some cases, a user may interact with the device 805 via the I/O controller 815 or via hardware components controlled by the I/O controller 815.

The transceiver 820 may communicate bi-directionally, via one or more antennas, wired, or wireless links as described above. For example, the transceiver 820 may represent a wireless transceiver and may communicate bi-directionally with another wireless transceiver. The transceiver 820 may also include a modem to modulate the packets and provide the modulated packets to the antennas for transmission, and to demodulate packets received from the antennas.

In some cases, the wireless device may include a single antenna 825. However, in some cases the device may have more than one antenna 825, which may be capable of concurrently transmitting or receiving multiple wireless transmissions.

The memory 830 may include random-access memory (RAM) and read-only memory (ROM). The memory 830 may store computer-readable, computer-executable code 835 including instructions that, when executed, cause the processor to perform various functions described herein. In some cases, the memory 830 may contain, among other things, a basic input/output system (BIOS) which may control basic hardware or software operation such as the interaction with peripheral components or devices.

The processor 840 may include an intelligent hardware device (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, the processor 840 may be configured to operate a memory array using a memory controller. In other cases, a memory controller may be integrated into the processor 840. The processor 840 may be configured to execute computer-readable instructions stored in a memory (e.g., the memory 830) to cause the device 805 to perform various functions (e.g., functions or tasks supporting distortion probing reference signals).

The code 835 may include instructions to implement aspects of the present disclosure, including instructions to support wireless communications. The code 835 may be stored in a non-transitory computer-readable medium such as system memory or other type of memory. In some cases, the code 835 may not be directly executable by the processor 840 but may cause a computer (e.g., when compiled and executed) to perform functions described herein.

Figure 9:
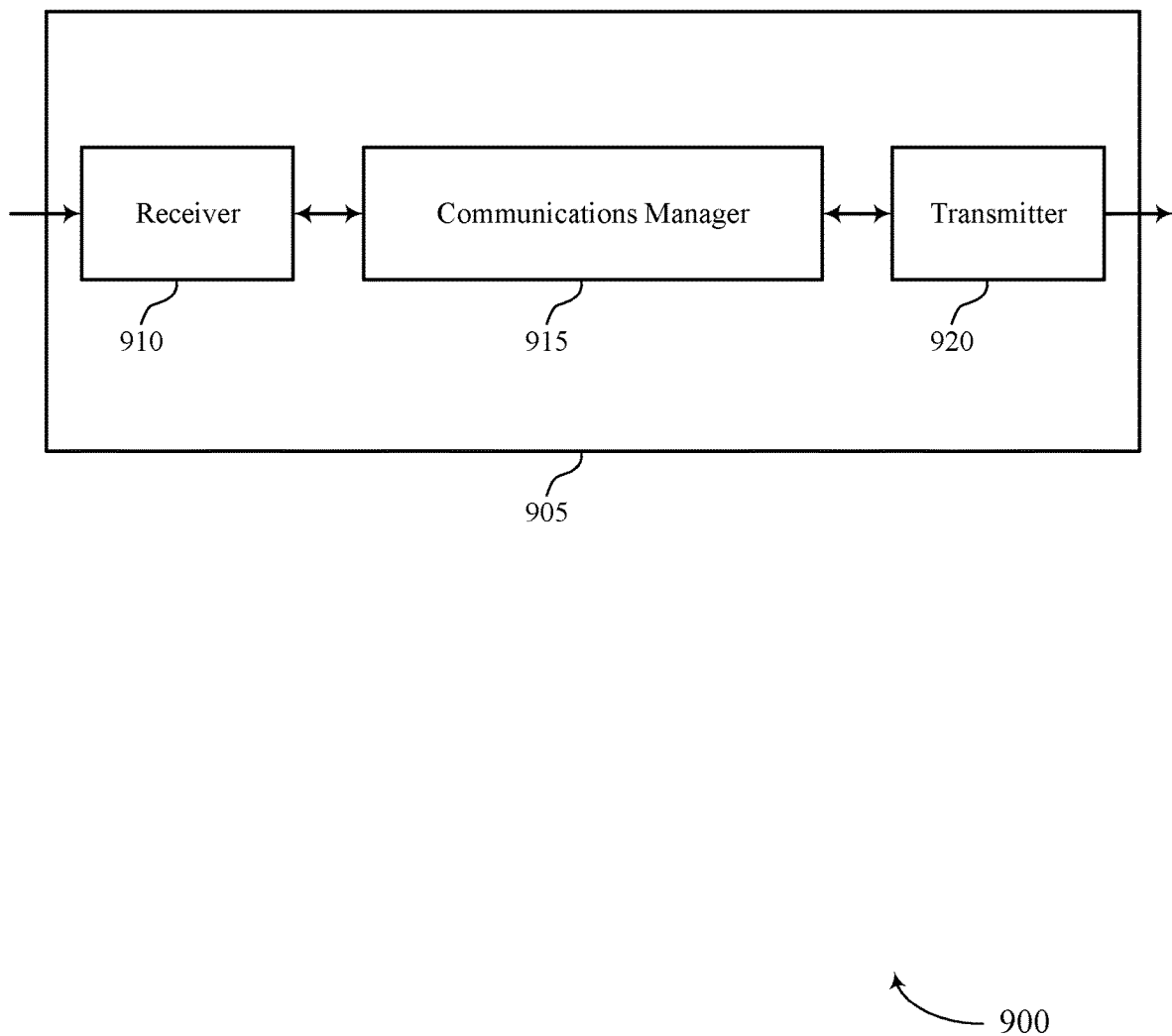
FIGS. 9 and 10 show block diagrams of devices that support distortion probing reference signals in accordance with one or more aspects of the present disclosure.

FIG. 9 shows a block diagram 900 of a device 905 that supports distortion probing reference signals in accordance with one or more aspects of the present disclosure. The device 905 may be an example of aspects of a first device such as a base station 105 as described herein. The device 905 may include a receiver 910, a communications manager 915, and a transmitter 920. The device 905 may also include a processor. Each of these components may be in communication with one another (e.g., via one or more buses).

The receiver 910 may receive information such as packets, user data, or control information associated with various information channels (e.g., control channels, data channels, and information related to distortion probing reference signals, etc.). Information may be passed on to other components of the device 905. The receiver 910 may be an example of aspects of the transceiver 1220 described with reference to FIG. 12. The receiver 910 may utilize a single antenna or a set of antennas.

In some examples, the communications manager 915 may transmit an indication configuring a second device to transmit a first reference signal with a first peak to average power ratio and a second reference signal with a second peak to average power ratio that is greater than the first peak to average power ratio, receive, from the second device, the first reference signal and the second reference signal based on transmitting the indication, determine a neural network model and one or more neural network weights corresponding to one or more transmission parameters associated with the second device based on the first reference signal and the second reference signal, estimate a transmission encoding metric and a reception decoding metric associated with the first reference signal and the second reference signal based on the neural network model and the neural network weights, transmit signaling associated with the neural network model and the neural network weights based on the estimating, and communicate with the second device based on the reception decoding metric.

In some examples, the communications manager 915 may transmit an indication configuring a second device to transmit a reference signal, receive the reference signal from the second device based on transmitting the indication, receive signaling associated with a neural network model and one or more neural network weights corresponding to one or more transmission parameters, where the neural network model and the neural network weights are based on the received reference signal, and communicate with the second device based on the received signaling.

The communications manager 915 as described herein may be implemented to realize one or more potential improvements. One implementation may allow the device 905 to save power by communicating with a second device (e.g., a base station 105 or a UE 115 as shown in FIG. 1) more efficiently. For example, the device 905 may efficiently communicate with the second device based on learning the nonlinear response of transmission components of the second device, as the device 905 may be able to adjust decoding components to compensate for the nonlinear response. The communications manager 915 may be an example of aspects of the communications manager 1210 described herein.

The communications manager 915, or its sub-components, may be implemented in hardware, code (e.g., software or firmware) executed by a processor, or any combination thereof. If implemented in code executed by a processor, the functions of the communications manager 915, or its sub-components may be executed by a general-purpose processor, a DSP, an ASIC, a FPGA or other programmable logic device, discrete gate or transistor logic, discrete hardware components, or any combination thereof designed to perform the functions described in the present disclosure.

The communications manager 915 may be an example of means for performing various aspects of managing distortion probing reference signals as described herein. The communications manager 915, or its sub-components, may be implemented in hardware (e.g., in communications management circuitry). The circuitry may comprise of processor, DSP, an ASIC, an FPGA or other programmable logic device, discrete gate or transistor logic, discrete hardware components, or any combination thereof designed to perform the functions described in the present disclosure.

In another implementation, the communications manager 915, or its sub-components, may be implemented in code (e.g., as communications management software or firmware) executed by a processor, or any combination thereof. If implemented in code executed by a processor, the functions of the communications manager 915, or its sub-components may be executed by a general-purpose processor, a DSP, an ASIC, a FPGA, or other programmable logic device In some examples, the communication manager 915 may be configured to perform various operations (e.g., receiving, determining, estimating, transmitting, communicating) using or otherwise in cooperation with the receiver 910, the transmitter 920, or both.

The communications manager 915, or its sub-components, may be physically located at various positions, including being distributed such that portions of functions are implemented at different physical locations by one or more physical components. In some examples, the communications manager 915, or its sub-components, may be a separate and distinct component in accordance with various aspects of the present disclosure. In some examples, the communications manager 915, or its sub-components, may be combined with one or more other hardware components, including but not limited to an I/O component, a transceiver, a network server, another computing device, one or more other components described in the present disclosure, or a combination thereof in accordance with various aspects of the present disclosure.

The transmitter 920 may transmit signals generated by other components of the device 905. In some examples, the transmitter 920 may be collocated with a receiver 910 in a transceiver module. For example, the transmitter 920 may be an example of aspects of the transceiver 1220 described with reference to FIG. 12. The transmitter 920 may utilize a single antenna or a set of antennas.

Figure 10:
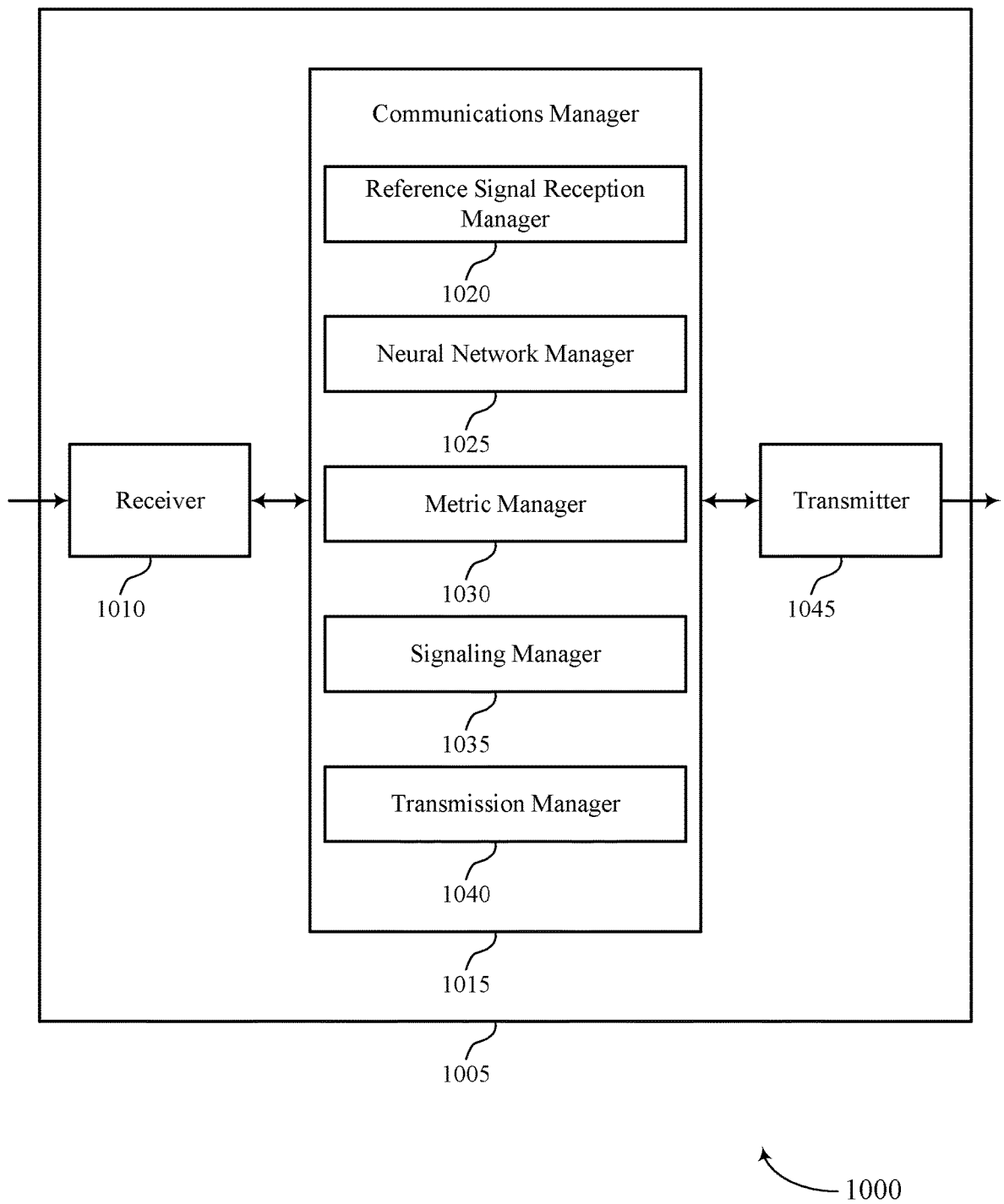

FIG. 10 shows a block diagram 1000 of a device 1005 that supports distortion probing reference signals in accordance with one or more aspects of the present disclosure. The device 1005 may be an example of aspects of a device 905, or a first device such as a base station 105 as described herein. The device 1005 may include a receiver 1010, a communications manager 1015, and a transmitter 1045. The device 1005 may also include a processor. Each of these components may be in communication with one another (e.g., via one or more buses).

The receiver 1010 may receive information such as packets, user data, or control information associated with various information channels (e.g., control channels, data channels, and information related to distortion probing reference signals, etc.). Information may be passed on to other components of the device 1005. The receiver 1010 may be an example of aspects of the transceiver 1220 described with reference to FIG. 12. The receiver 1010 may utilize a single antenna or a set of antennas.

The communications manager 1015 may be an example of aspects of the communications manager 915 as described herein. The communications manager 1015 may include a reference signal reception manager 1020, a neural network manager 1025, a metric manager 1030, a signaling manager 1035, and a transmission manager 1040. The communications manager 1015 may be an example of aspects of the communications manager 1210 described herein.

In some examples, the reference signal reception manager 1020 may transmit an indication configuring a second device to transmit a first reference signal with a first peak to average power ratio and a second reference signal with a second peak to average power ratio that is greater than the first peak to average power ratio and receive, from the second device, the first reference signal and the second reference signal based on transmitting the indication. The neural network manager 1025 may determine a neural network model and one or more neural network weights corresponding to one or more transmission parameters associated with the second device based on the first reference signal and the second reference signal. The metric manager 1030 may estimate a transmission encoding metric and a reception decoding metric associated with the first reference signal and the second reference signal based on the neural network model and the neural network weights. The signaling manager 1035 may transmit signaling associated with the neural network model and the neural network weights based on the estimating. The transmission manager 1040 may communicate with the second device based on the reception decoding metric.

In some examples, the reference signal reception manager 1020 may transmit an indication configuring a second device to transmit a reference signal and receive the reference signal from the second device based on transmitting the indication. The signaling manager 1035 may receive signaling associated with a neural network model and one or more neural network weights corresponding to one or more transmission parameters, where the neural network model and the neural network weights are based on the received reference signal. The transmission manager 1040 may communicate with the second device based on the received signaling.

The transmitter 1045 may transmit signals generated by other components of the device 1005. In some examples, the transmitter 1045 may be collocated with a receiver 1010 in a transceiver module. For example, the transmitter 1045 may be an example of aspects of the transceiver 1220 described with reference to FIG. 12. The transmitter 1045 may utilize a single antenna or a set of antennas.

Figure 11:
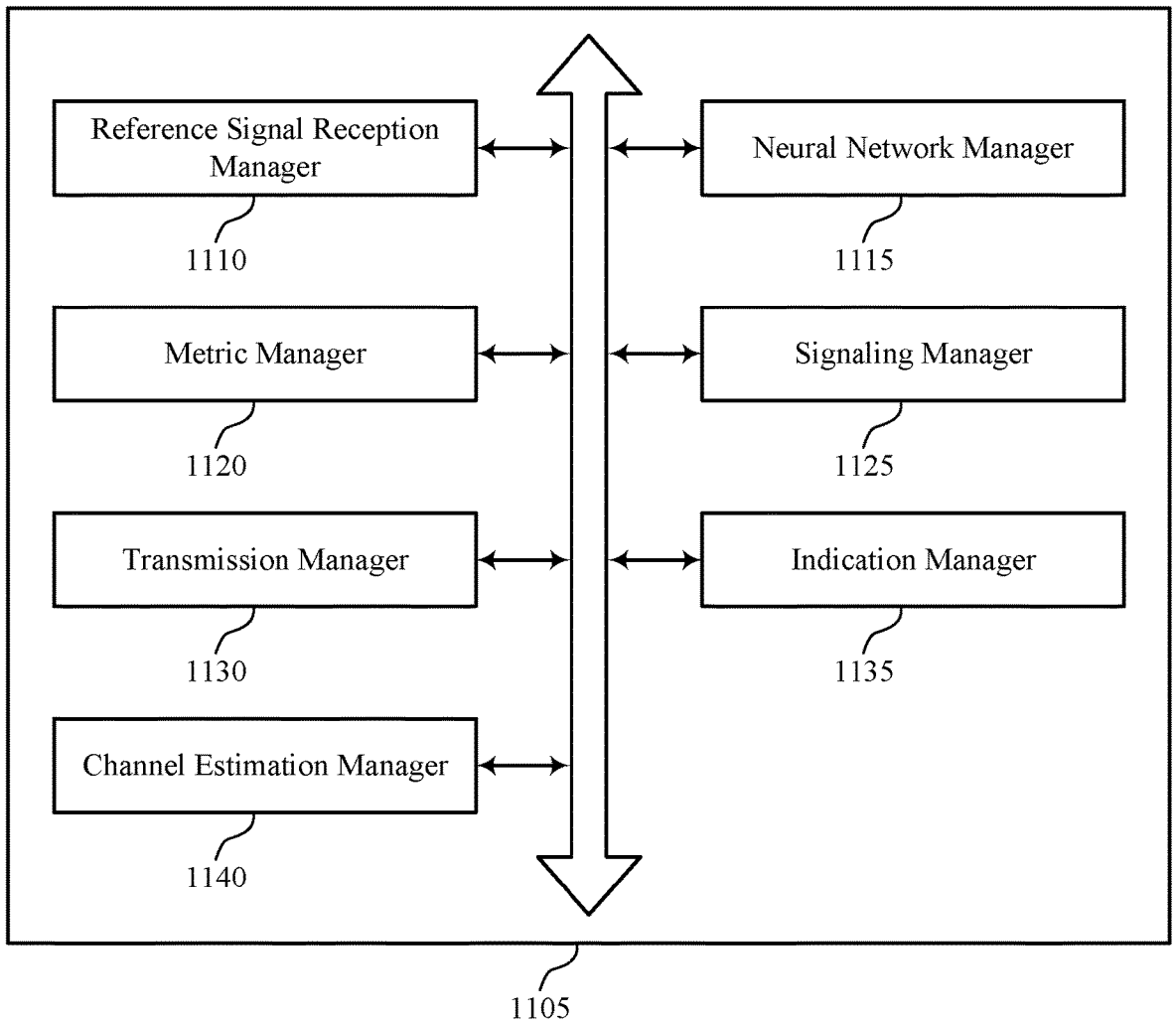
FIG. 11 shows a block diagram of a communications manager that supports distortion probing reference signals in accordance with one or more aspects of the present disclosure.

FIG. 11 shows a block diagram 1100 of a communications manager 1105 that supports distortion probing reference signals in accordance with one or more aspects of the present disclosure. The communications manager 1105 may be an example of aspects of a communications manager 915, a communications manager 1015, or a communications manager 1210 described herein. The communications manager 1105 may include a reference signal reception manager 1110, a neural network manager 1115, a metric manager 1120, a signaling manager 1125, a transmission manager 1130, an indication manager 1135, and a channel estimation manager 1140. Each of these modules may communicate, directly or indirectly, with one another (e.g., via one or more buses).

In some examples, the indication manager 1135 may transmit an indication configuring a second device to transmit a first reference signal with a first peak to average power ratio and a second reference signal with a second peak to average power ratio that is greater than the first peak to average power ratio. In some examples, the indication includes a radio resource control message, a downlink control information message, or both.

In some examples, the reference signal reception manager 1110 may receive, from the second device, the first reference signal and the second reference signal based on transmitting the indication. In some cases, the first reference signal includes a demodulation reference signal. In some cases, the second reference signal includes a set of contiguous symbols in a time domain.

In some examples, the neural network manager 1115 may determine a neural network model and one or more neural network weights corresponding to one or more transmission parameters associated with the second device based on the first reference signal and the second reference signal. In some cases, the neural network model and the neural network weights correspond to a nonlinear response associated with transmissions at the second device.

In some examples, the metric manager 1120 may estimate a transmission encoding metric and a reception decoding metric associated with the first reference signal and the second reference signal based on the neural network model and the neural network weights. In some cases, the transmission encoding metric includes a second neural network model and a second one or more neural network weights associated with encoding the transmissions at the second device based on the nonlinear response. In some cases, the reception decoding metric includes a third neural network model and a third one or more neural network weights associated with decoding transmissions received at the first device based on the nonlinear response.

In some examples, the signaling manager 1125 may transmit signaling associated with the neural network model and the neural network weights based on the estimating. In some examples, the signaling manager 1125 may transmit an indication of the transmission encoding metric associated with the first reference signal and the second reference signal.

In some examples, the signaling manager 1125 may transmit a grant scheduling a transmission that is encoded based on the transmission encoding metric, where communicating with the second device includes receiving the scheduled transmission. In some cases, the grant includes an uplink grant in a downlink control information message. In some cases, the scheduled transmission includes an uplink shared channel transmission.

In some examples, the transmission manager 1130 may communicate with the second device based on the reception decoding metric.

In some examples, the channel estimation manager 1140 may determine a channel estimate based on receiving the first reference signal, where communicating with the second device is further based on the determined channel estimate.

In some examples, the indication manager 1135 may transmit an indication configuring a second device to transmit a reference signal. In some examples, the indication includes a radio resource control message, a downlink control information message, or both.

In some examples, the reference signal reception manager 1110 may receive the reference signal from the second device based on transmitting the indication. In some cases, the reference signal includes a set of contiguous symbols in a time domain.

In some examples, the signaling manager 1125 may receive signaling associated with a neural network model and one or more neural network weights corresponding to one or more transmission parameters, where the neural network model and the neural network weights are based on the received reference signal. In some examples, the signaling manager 1125 may receive an indication of the reception decoding metric, where estimating the reception decoding metric is based on the received indication.

In some examples, the signaling manager 1125 may transmit an indication configuring a periodicity of the signaling associated with the neural network model and the neural network weights, where receiving the signaling is based on the configured periodicity.

In some examples, the signaling manager 1125 may transmit a grant scheduling a transmission including the signaling associated with the neural network model and the neural network weights, where receiving the signaling is based on the grant. In some cases, the grant includes an uplink grant in a downlink control information message. In some cases, the scheduled transmission includes an uplink shared channel transmission. In some cases, the neural network model and the neural network weights correspond to a nonlinear response associated with transmissions at the second device.

In some examples, the metric manager 1120 may estimate a reception decoding metric associated with the reference signal based on the received signaling, where communicating with the second device is further based on the estimated reception decoding metric. In some cases, the reception decoding metric includes a second neural network model and a second one or more neural network weights associated with decoding transmissions received at the first device based on the nonlinear response.

In some examples, the transmission manager 1130 may communicate with the second device based on the received signaling.

Figure 12:
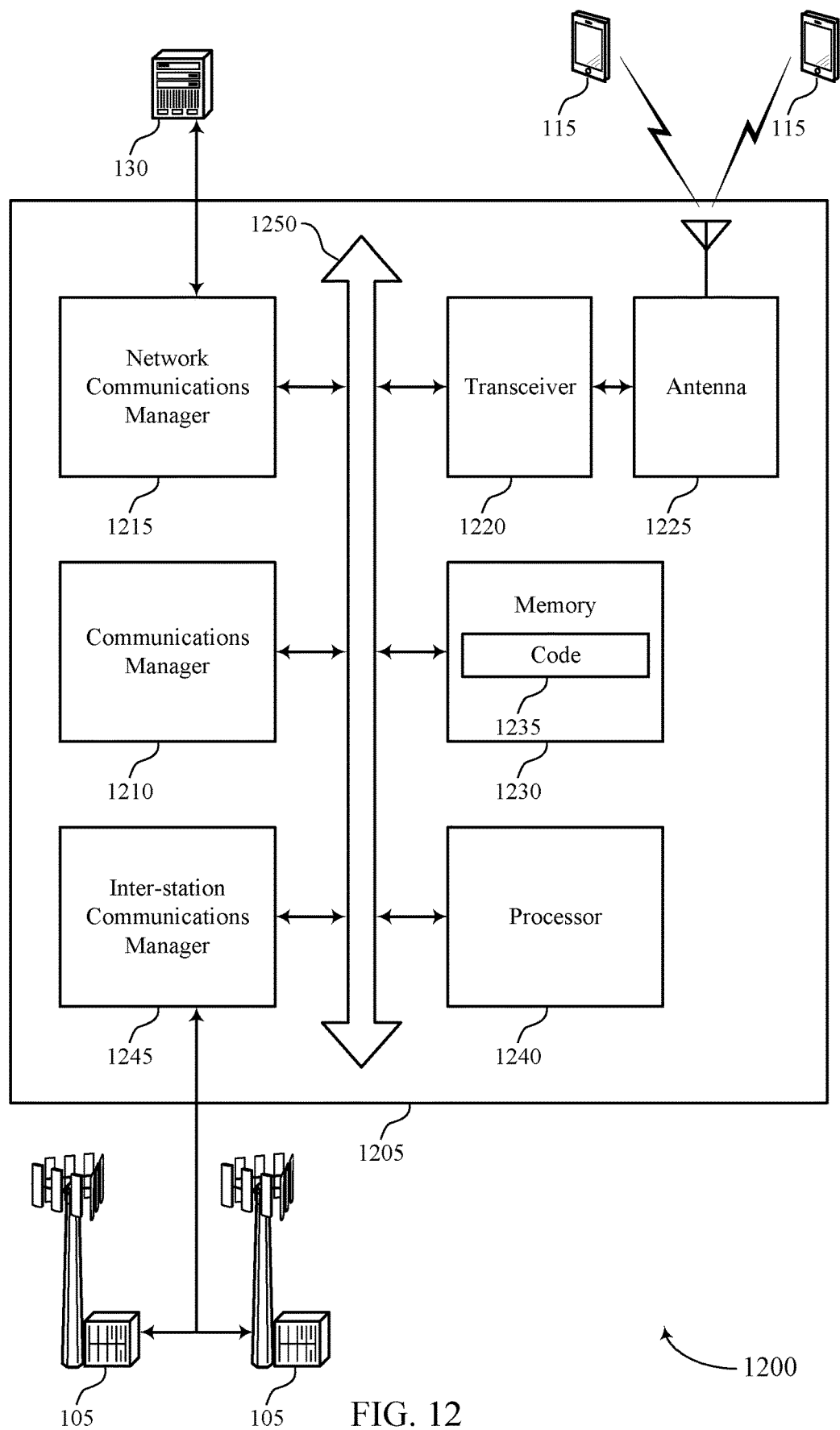
FIG. 12 shows a diagram of a system including a device that supports distortion probing reference signals in accordance with one or more aspects of the present disclosure.

FIG. 12 shows a diagram of a system 1200 including a device 1205 that supports distortion probing reference signals in accordance with one or more aspects of the present disclosure. The device 1205 may be an example of or include the components of device 905, device 1005, or a first device such as a base station 105 as described herein. The device 1205 may include components for bi-directional voice and data communications including components for transmitting and receiving communications, including a communications manager 1210, a network communications manager 1215, a transceiver 1220, an antenna 1225, memory 1230, a processor 1240, and an inter-station communications manager 1245. These components may be in electronic communication via one or more buses (e.g., bus 1250).

In some examples, the communications manager 1210 may transmit an indication configuring a second device to transmit a first reference signal with a first peak to average power ratio and a second reference signal with a second peak to average power ratio that is greater than the first peak to average power ratio, receive, from the second device, the first reference signal and the second reference signal based on transmitting the indication, determine a neural network model and one or more neural network weights corresponding to one or more transmission parameters associated with the second device based on the first reference signal and the second reference signal, estimate a transmission encoding metric and a reception decoding metric associated with the first reference signal and the second reference signal based on the neural network model and the neural network weights, transmit signaling associated with the neural network model and the neural network weights based on the estimating, and communicate with the second device based on the reception decoding metric.

In some examples, the communications manager 1210 may transmit an indication configuring a second device to transmit a reference signal, receive the reference signal from the second device based on transmitting the indication, receive signaling associated with a neural network model and one or more neural network weights corresponding to one or more transmission parameters, where the neural network model and the neural network weights are based on the received reference signal, and communicate with the second device based on the received signaling.

The network communications manager 1215 may manage communications with the core network (e.g., via one or more wired backhaul links). For example, the network communications manager 1215 may manage the transfer of data communications for client devices, such as one or more UEs 115.

The transceiver 1220 may communicate bi-directionally, via one or more antennas, wired, or wireless links as described above. For example, the transceiver 1220 may represent a wireless transceiver and may communicate bi-directionally with another wireless transceiver. The transceiver 1220 may also include a modem to modulate the packets and provide the modulated packets to the antennas for transmission, and to demodulate packets received from the antennas.

In some cases, the wireless device may include a single antenna 1225. However, in some cases the device may have more than one antenna 1225, which may be capable of concurrently transmitting or receiving multiple wireless transmissions.

The memory 1230 may include RAM, ROM, or a combination thereof. The memory 1230 may store computer-readable code 1235 including instructions that, when executed by a processor (e.g., the processor 1240) cause the device to perform various functions described herein. In some cases, the memory 1230 may contain, among other things, a BIOS which may control basic hardware or software operation such as the interaction with peripheral components or devices.

The processor 1240 may include an intelligent hardware device (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 1240 may be configured to operate a memory array using a memory controller. In some cases, a memory controller may be integrated into processor 1240. The processor 1240 may be configured to execute computer-readable instructions stored in a memory (e.g., the memory 1230) to cause the device 1205 to perform various functions (e.g., functions or tasks supporting distortion probing reference signals).

The inter-station communications manager 1245 may manage communications with other base station 105, and may include a controller or scheduler for controlling communications with UEs 115 in cooperation with other base stations 105. For example, the inter-station communications manager 1245 may coordinate scheduling for transmissions to UEs 115 for various interference mitigation techniques such as beamforming or joint transmission. In some examples, the inter-station communications manager 1245 may provide an X2 interface within an LTE/LTE-A wireless communication network technology to provide communication between base stations 105.

The code 1235 may include instructions to implement aspects of the present disclosure, including instructions to support wireless communications. The code 1235 may be stored in a non-transitory computer-readable medium such as system memory or other type of memory. In some cases, the code 1235 may not be directly executable by the processor 1240 but may cause a computer (e.g., when compiled and executed) to perform functions described herein.

Figure 13:
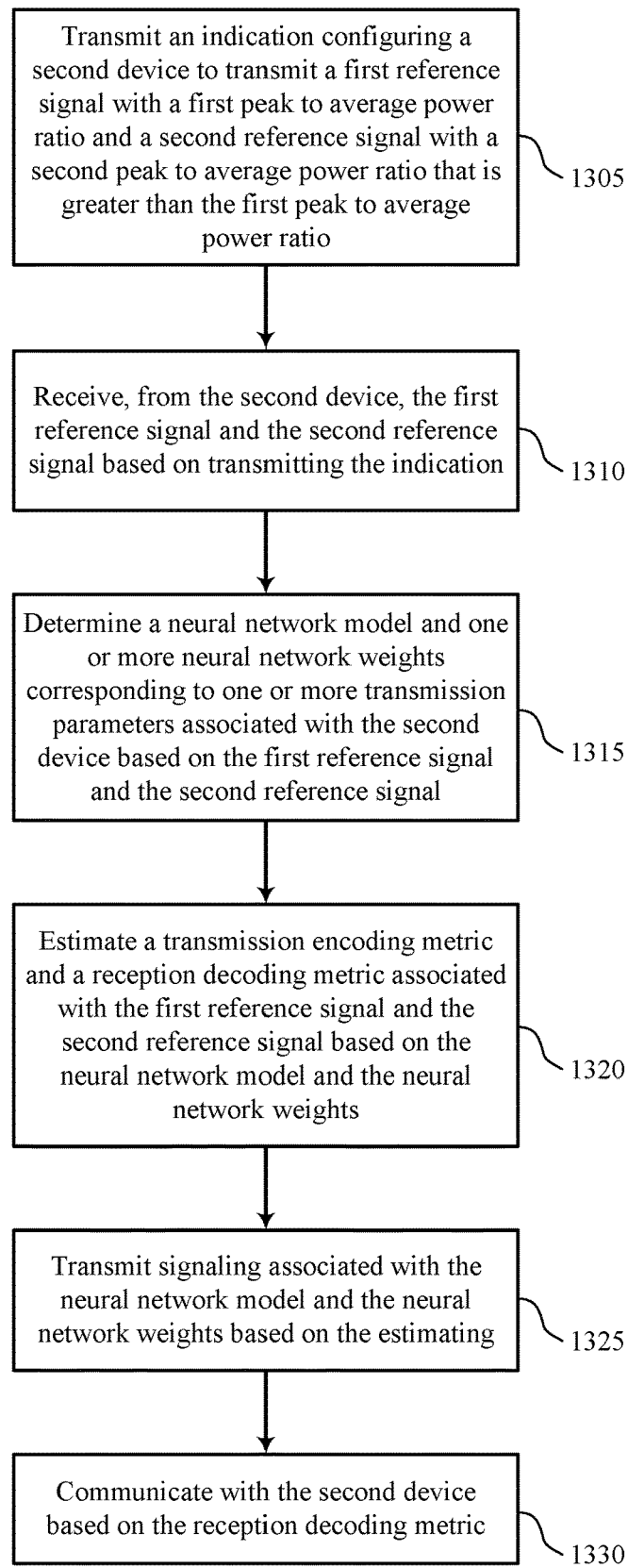
FIGS. 13 through 16 show flowcharts illustrating methods that support distortion probing reference signals in accordance with one or more aspects of the present disclosure.

FIG. 13 shows a flowchart illustrating a method 1300 that supports distortion probing reference signals in accordance with one or more aspects of the present disclosure. The operations of method 1300 may be implemented by a first device (e.g., a base station, a UE, etc.) or its components as described herein. For example, the operations of method 1300 may be performed by a communications manager as described with reference to FIGS. 9 through 12. In some examples, a first device may execute a set of instructions to control the functional elements of the first device to perform the functions described below. Additionally or alternatively, a first device may perform aspects of the functions described below using special-purpose hardware.

At 1305, the first device may transmit an indication configuring a second device to transmit a first reference signal with a first peak to average power ratio and a second reference signal with a second peak to average power ratio that is greater than the first peak to average power ratio. The operations of 1305 may be performed according to the methods described herein. In some examples, aspects of the operations of 1305 may be performed by an indication manager as described with reference to FIGS. 9 through 12.

At 1310, the first device may receive, from the second device, the first reference signal and the second reference signal based on transmitting the indication. The operations of 1310 may be performed according to the methods described herein. In some examples, aspects of the operations of 1310 may be performed by a reference signal reception manager as described with reference to FIGS. 9 through 12.

At 1315, the first device may determine a neural network model and one or more neural network weights corresponding to one or more transmission parameters associated with the second device based on the first reference signal and the second reference signal. The operations of 1315 may be performed according to the methods described herein. In some examples, aspects of the operations of 1315 may be performed by a neural network manager as described with reference to FIGS. 9 through 12.

At 1320, the first device may estimate a transmission encoding metric and a reception decoding metric associated with the first reference signal and the second reference signal based on the neural network model and the neural network weights. The operations of 1320 may be performed according to the methods described herein. In some examples, aspects of the operations of 1320 may be performed by a metric manager as described with reference to FIGS. 9 through 12.

At 1325, the first device may transmit signaling associated with the neural network model and the neural network weights based on the estimating. The operations of 1325 may be performed according to the methods described herein. In some examples, aspects of the operations of 1325 may be performed by a signaling manager as described with reference to FIGS. 9 through 12.

At 1330, the first device may communicate with the second device based on the reception decoding metric. The operations of 1330 may be performed according to the methods described herein. In some examples, aspects of the operations of 1330 may be performed by a transmission manager as described with reference to FIGS. 9 through 12.

Figure 14:
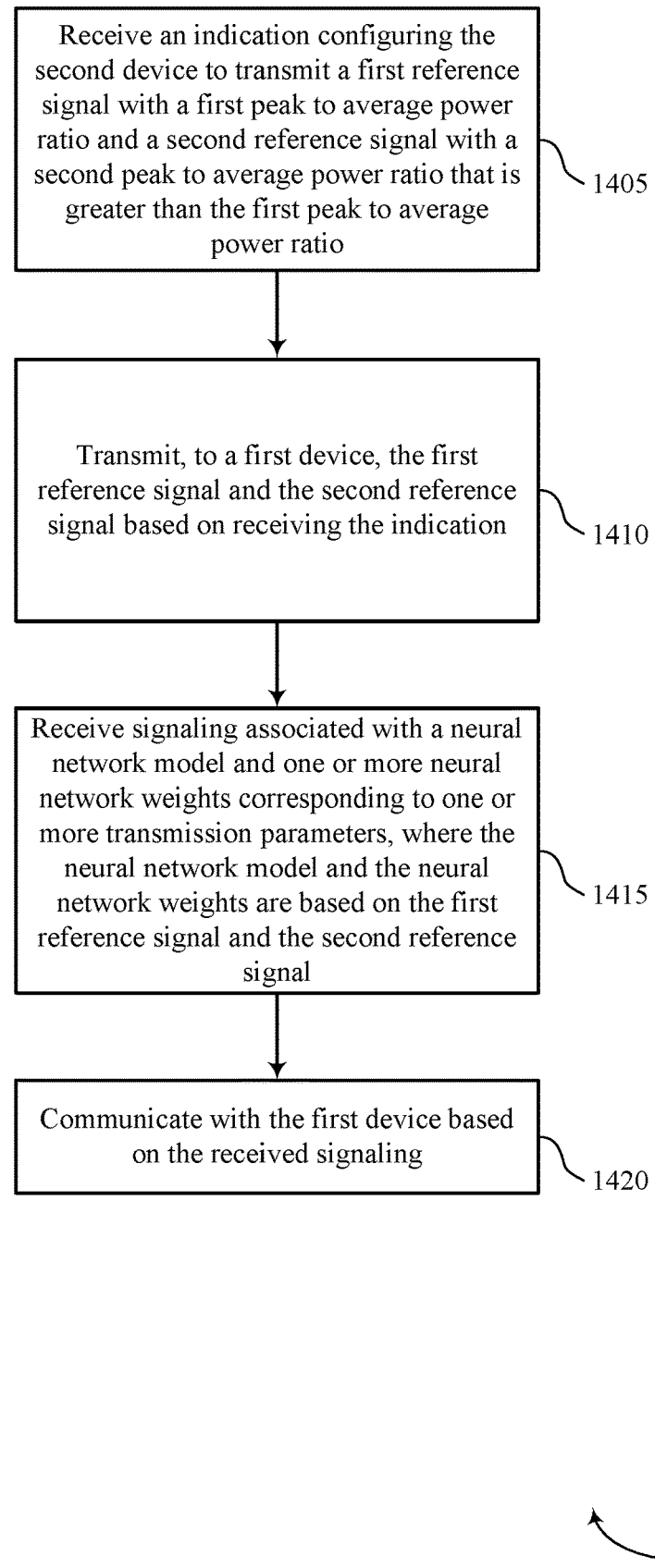

FIG. 14 shows a flowchart illustrating a method 1400 that supports distortion probing reference signals in accordance with one or more aspects of the present disclosure. The operations of method 1400 may be implemented by a second device (e.g., a UE, a base station, etc.) or its components as described herein. For example, the operations of method 1400 may be performed by a communications manager as described with reference to FIGS. 5 through 8. In some examples, a second device may execute a set of instructions to control the functional elements of the second device to perform the functions described below. Additionally or alternatively, a second device may perform aspects of the functions described below using special-purpose hardware.

At 1405, the second device may receive an indication configuring the second device to transmit a first reference signal with a first peak to average power ratio and a second reference signal with a second peak to average power ratio that is greater than the first peak to average power ratio. The operations of 1405 may be performed according to the methods described herein. In some examples, aspects of the operations of 1405 may be performed by a reference signal transmission manager as described with reference to FIGS. 5 through 8.

At 1410, the second device may transmit, to a first device, the first reference signal and the second reference signal based on receiving the indication. The operations of 1410 may be performed according to the methods described herein. In some examples, aspects of the operations of 1410 may be performed by a reference signal transmission manager as described with reference to FIGS. 5 through 8.

At 1415, the second device may receive signaling associated with a neural network model and one or more neural network weights corresponding to one or more transmission parameters, where the neural network model and the neural network weights are based on the first reference signal and the second reference signal. The operations of 1415 may be performed according to the methods described herein. In some examples, aspects of the operations of 1415 may be performed by a signaling component as described with reference to FIGS. 5 through 8.

At 1420, the second device may communicate with the first device based on the received signaling. The operations of 1420 may be performed according to the methods described herein. In some examples, aspects of the operations of 1420 may be performed by a transmission component as described with reference to FIGS. 5 through 8.

Figure 15:
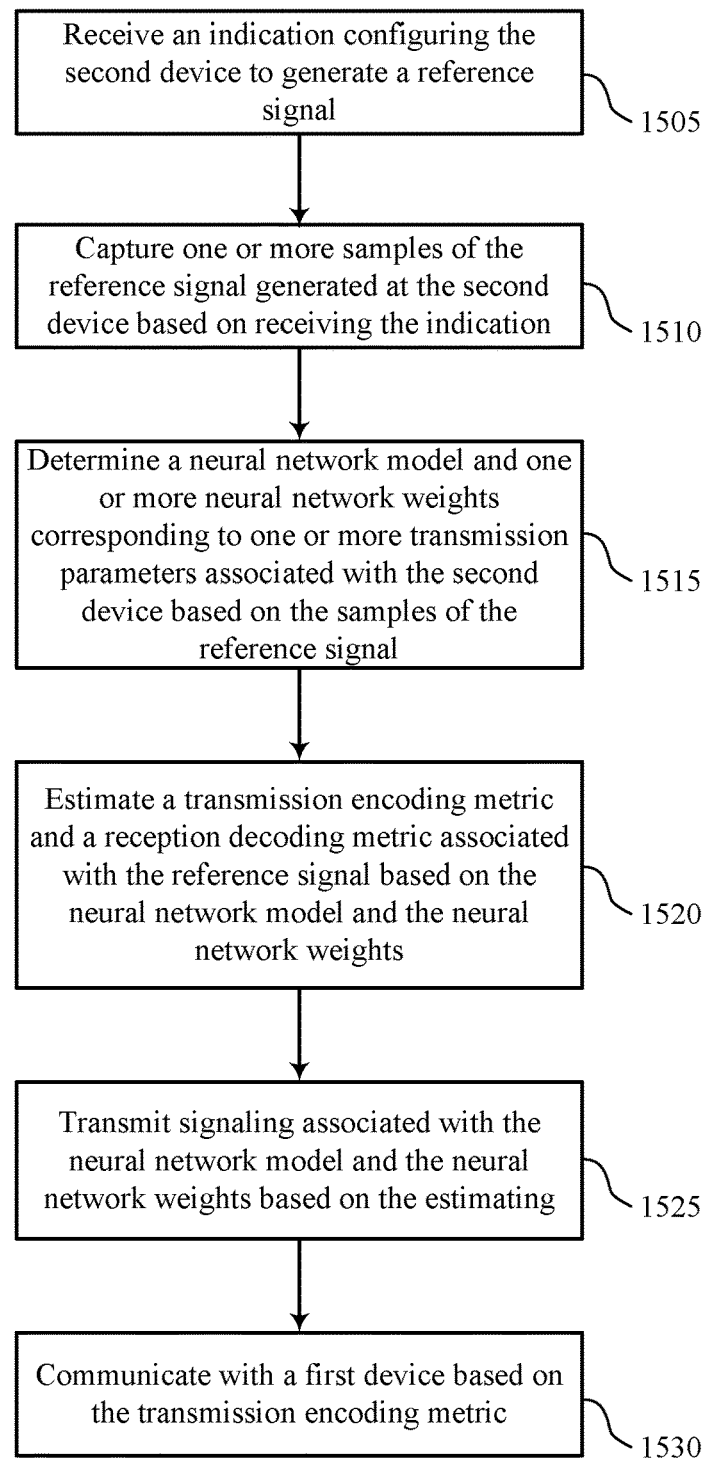

FIG. 15 shows a flowchart illustrating a method 1500 that supports distortion probing reference signals in accordance with one or more aspects of the present disclosure. The operations of method 1500 may be implemented by a second device (e.g., a UE, a base station, etc.) or its components as described herein. For example, the operations of method 1500 may be performed by a communications manager as described with reference to FIGS. 5 through 8. In some examples, a second device may execute a set of instructions to control the functional elements of the second device to perform the functions described below. Additionally or alternatively, a second device may perform aspects of the functions described below using special-purpose hardware.

At 1505, the second device may receive an indication configuring the second device to generate a reference signal. The operations of 1505 may be performed according to the methods described herein. In some examples, aspects of the operations of 1505 may be performed by a reference signal transmission manager as described with reference to FIGS. 5 through 8.

At 1510, the second device may capture one or more samples of the reference signal generated at the second device based on receiving the indication. The operations of 1510 may be performed according to the methods described herein. In some examples, aspects of the operations of 1510 may be performed by a reference signal transmission manager as described with reference to FIGS. 5 through 8.

At 1515, the second device may determine a neural network model and one or more neural network weights corresponding to one or more transmission parameters associated with the second device based on the samples of the reference signal. The operations of 1515 may be performed according to the methods described herein. In some examples, aspects of the operations of 1515 may be performed by a neural network component as described with reference to FIGS. 5 through 8.

At 1520, the second device may estimate a transmission encoding metric and a reception decoding metric associated with the reference signal based on the neural network model and the neural network weights. The operations of 1520 may be performed according to the methods described herein. In some examples, aspects of the operations of 1520 may be performed by a metric component as described with reference to FIGS. 5 through 8.

At 1525, the second device may transmit signaling associated with the neural network model and the neural network weights based on the estimating. The operations of 1525 may be performed according to the methods described herein. In some examples, aspects of the operations of 1525 may be performed by a signaling component as described with reference to FIGS. 5 through 8.

At 1530, the second device may communicate with a first device based on the transmission encoding metric. The operations of 1530 may be performed according to the methods described herein. In some examples, aspects of the operations of 1530 may be performed by a transmission component as described with reference to FIGS. 5 through 8.

Figure 16:
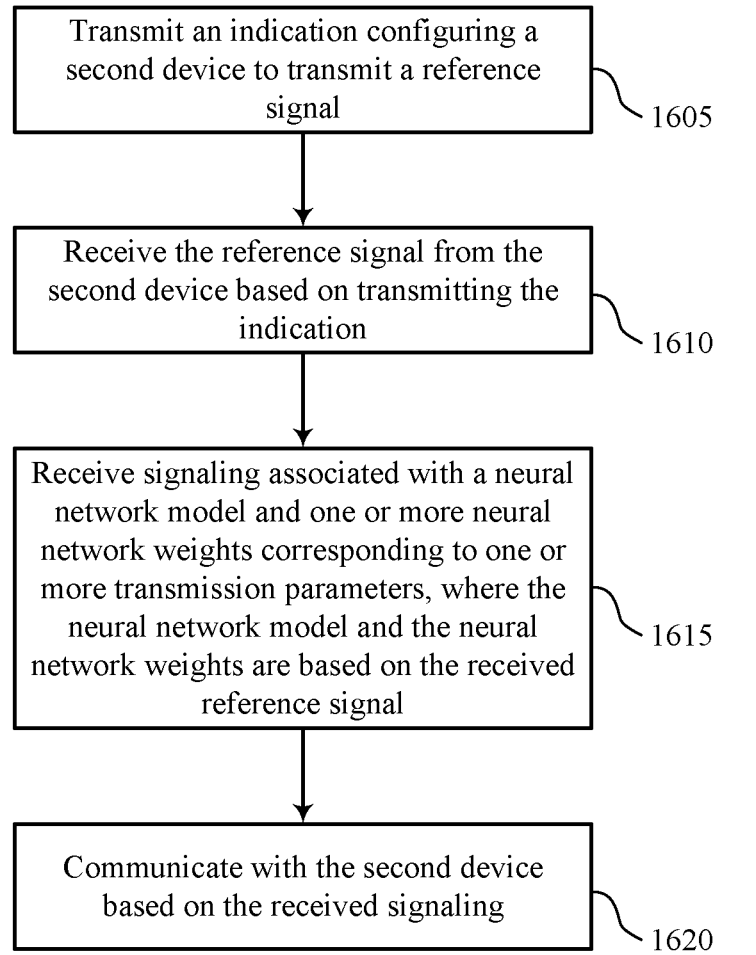

FIG. 16 shows a flowchart illustrating a method 1600 that supports distortion probing reference signals in accordance with one or more aspects of the present disclosure. The operations of method 1600 may be implemented by a first device (e.g., a base station, a UE, etc.) or its components as described herein. For example, the operations of method 1600 may be performed by a communications manager as described with reference to FIGS. 9 through 12. In some examples, a first device may execute a set of instructions to control the functional elements of the first device to perform the functions described below. Additionally or alternatively, a first device may perform aspects of the functions described below using special-purpose hardware.

At 1605, the first device may transmit an indication configuring a second device to transmit a reference signal. The operations of 1605 may be performed according to the methods described herein. In some examples, aspects of the operations of 1605 may be performed by an indication manager as described with reference to FIGS. 9 through 12.

At 1610, the first device may receive the reference signal from the second device based on transmitting the indication. The operations of 1610 may be performed according to the methods described herein. In some examples, aspects of the operations of 1610 may be performed by a reference signal reception manager as described with reference to FIGS. 9 through 12.

At 1615, the first device may receive signaling associated with a neural network model and one or more neural network weights corresponding to one or more transmission parameters, where the neural network model and the neural network weights are based on the received reference signal. The operations of 1615 may be performed according to the methods described herein. In some examples, aspects of the operations of 1615 may be performed by a signaling manager as described with reference to FIGS. 9 through 12.

At 1620, the first device may communicate with the second device based on the received signaling. The operations of 1620 may be performed according to the methods described herein. In some examples, aspects of the operations of 1620 may be performed by a transmission manager as described with reference to FIGS. 9 through 12.

Aspect 1: A method for wireless communications at a first device, comprising: transmitting an indication configuring a second device to transmit a first reference signal with a first peak to average power ratio and a second reference signal with a second peak to average power ratio that is greater than the first peak to average power ratio; receiving, from the second device, the first reference signal and the second reference signal based at least in part on transmitting the indication; determining a neural network model and one or more neural network weights corresponding to one or more transmission parameters associated with the second device based at least in part on the first reference signal and the second reference signal; estimating a transmission encoding metric and a reception decoding metric associated with the first reference signal and the second reference signal based at least in part on the neural network model and the neural network weights; transmitting signaling associated with the neural network model and the neural network weights based at least in part on the estimating; and communicating with the second device based at least in part on the reception decoding metric.

Aspect 2: The method of aspect 1, wherein the indication comprises a radio resource control message, a downlink control information message, or both.

Aspect 3: The method of any of aspects 1 or 2, wherein transmitting the signaling comprises: transmitting an indication of the transmission encoding metric associated with the first reference signal and the second reference signal.

Aspect 4: The method of any of aspects 1 to 3, wherein transmitting the signaling comprises: transmitting a grant scheduling a transmission that is encoded based at least in part on the transmission encoding metric, wherein communicating with the second device comprises receiving the scheduled transmission.

Aspect 5: The method of any of aspects 1 to 4, wherein: the grant comprises an uplink grant in a downlink control information message; and the scheduled transmission comprises an uplink shared channel transmission.

Aspect 6: The method of any of aspects 1 to 5, further comprising: determining a channel estimate based at least in part on receiving the first reference signal, wherein communicating with the second device is further based at least in part on the determined channel estimate.

Aspect 7: The method of any of aspects 1 to 6, wherein: the neural network model and the neural network weights correspond to a nonlinear response associated with transmissions at the second device; the transmission encoding metric comprises a second neural network model and a second one or more neural network weights associated with encoding the transmissions at the second device based at least in part on the nonlinear response; and the reception decoding metric comprises a third neural network model and a third one or more neural network weights associated with decoding transmissions received at the first device based at least in part on the nonlinear response.

Aspect 8: The method of any of aspects 1 to 7, wherein the first reference signal comprises a demodulation reference signal.

Aspect 9: The method of any of aspects 1 to 8, wherein the second reference signal comprises a set of contiguous symbols in a time domain.

Aspect 10: An apparatus comprising at least one means for performing a method of any of aspects 1 to 9.

Aspect 11: An apparatus for wireless communications comprising a processor; and memory coupled to the processor, the processor and memory configured to perform a method of any of aspects 1 to 9.

Aspect 12: A non-transitory computer-readable medium storing code for wireless communications, the code comprising instructions executable by a processor to perform a method of any of aspects 1 to 9.

Aspect 13: A method for wireless communications at a second device, comprising: receiving an indication configuring the second device to transmit a first reference signal with a first peak to average power ratio and a second reference signal with a second peak to average power ratio that is greater than the first peak to average power ratio; transmitting, to a first device, the first reference signal and the second reference signal based at least in part on receiving the indication; receiving signaling associated with a neural network model and one or more neural network weights corresponding to one or more transmission parameters, wherein the neural network model and the neural network weights are based at least in part on the first reference signal and the second reference signal; and communicating with the first device based at least in part on the received signaling.

Aspect 14: The method of aspect 13, wherein the indication comprises a radio resource control message, a downlink control information message, or both.

Aspect 15: The method of any of aspects 13 or 14, further comprising: estimating a transmission encoding metric associated with the first reference signal and the second reference signal based at least in part on the received signaling, wherein communicating with the first device is further based at least in part on the estimated transmission encoding metric.

Aspect 16: The method of any of aspect 13 to 15, wherein receiving the signaling comprises: receiving an indication of the transmission encoding metric, wherein estimating the transmission encoding metric is based at least in part on the received indication.

Aspect 17: The method of any of aspects 13 to 16, wherein: the neural network model and the neural network weights correspond to a nonlinear response associated with transmissions at the second device; and the transmission encoding metric comprises a second neural network model and a second one or more neural network weights associated with encoding the transmissions at the second device based at least in part on the nonlinear response.

Aspect 18: The method of any of aspect 13 to 17, wherein receiving the signaling comprises: receiving a grant scheduling a transmission that is encoded based at least in part on a transmission encoding metric associated with the first reference signal and the second reference signal, wherein communicating with the first device comprises transmitting the scheduled transmission.

Aspect 19: The method of any of aspects 13 to 18, wherein: the grant comprises an uplink grant in a downlink control information message; and the scheduled transmission comprises an uplink shared channel transmission.

Aspect 20: The method of any of aspects 13 to 19, wherein the first reference signal comprises a demodulation reference signal.

Aspect 21: The method of any of aspects 13 to 20, wherein the second reference signal comprises a set of contiguous symbols in a time domain.

Aspect 22: An apparatus comprising at least one means for performing a method of any of aspects 13 to 21.

Aspect 23: An apparatus for wireless communications comprising a processor; and memory coupled to the processor, the processor and memory configured to perform a method of any of aspects 13 to 21.

Aspect 24: A non-transitory computer-readable medium storing code for wireless communications, the code comprising instructions executable by a processor to perform a method of any of aspects 13 to 21.

Aspect 25: A method for wireless communications at a second device, comprising: receiving an indication configuring the second device to generate a reference signal; capturing one or more samples of the reference signal generated at the second device based at least in part on receiving the indication; determining a neural network model and one or more neural network weights corresponding to one or more transmission parameters associated with the second device based at least in part on the samples of the reference signal; estimating a transmission encoding metric and a reception decoding metric associated with the reference signal based at least in part on the neural network model and the neural network weights; transmitting signaling associated with the neural network model and the neural network weights based at least in part on the estimating; and communicating with a first device based at least in part on the transmission encoding metric.

Aspect 26: The method of aspect 25, wherein the indication comprises a radio resource control message, a downlink control information message, or both.

Aspect 27: The method of any of aspects 25 or 26, wherein transmitting the signaling comprises: transmitting, to the first device, an indication of the reception decoding metric associated with the reference signal.

Aspect 28: The method of any of aspects 25 to 27, further comprising: receiving an indication configuring a periodicity of the signaling associated with the neural network model and the neural network weights, wherein transmitting the signaling is based at least in part on the configured periodicity.

Aspect 29: The method of any of aspects 25 to 28, further comprising: receiving a grant scheduling a transmission comprising the signaling associated with the neural network model and the neural network weights, wherein transmitting the signaling is based at least in part on the grant.

Aspect 30: The method of any of aspects 25 to 29, wherein: the grant comprises an uplink grant in a downlink control information message; and the scheduled transmission comprises an uplink shared channel transmission.

Aspect 31: The method of any of aspects 25 to 30, wherein: the neural network model and the neural network weights correspond to a nonlinear response associated with transmissions at the second device; the reception decoding metric comprises a second neural network model and a second one or more neural network weights associated with decoding transmissions received at the first device based at least in part on the nonlinear response; and the transmission encoding metric comprises a third neural network model and a third one or more neural network weights associated with encoding the transmissions at the second device based at least in part on the nonlinear response.

Aspect 32: The method of any of aspects 25 to 31, wherein the reference signal comprises a set of contiguous symbols in a time domain.

Aspect 33: An apparatus comprising at least one means for performing a method of any of aspects 25 to 32.

Aspect 34: An apparatus for wireless communications comprising a processor; and memory coupled to the processor, the processor and memory configured to perform a method of any of aspects 25 to 32.

Aspect 35: A non-transitory computer-readable medium storing code for wireless communications, the code comprising instructions executable by a processor to perform a method of any of aspects 25 to 32.

Aspect 36: A method for wireless communications at a first device, comprising: transmitting an indication configuring a second device to transmit a reference signal; receiving the reference signal from the second device based at least in part on transmitting the indication; receiving signaling associated with a neural network model and one or more neural network weights corresponding to one or more transmission parameters, wherein the neural network model and the neural network weights are based at least in part on the received reference signal; and communicating with the second device based at least in part on the received signaling.

Aspect 37: The method of aspect 36, wherein the indication comprises a radio resource control message, a downlink control information message, or both.

Aspect 38: The method of any of aspects 36 or 37, further comprising: estimating a reception decoding metric associated with the reference signal based at least in part on the received signaling, wherein communicating with the second device is further based at least in part on the estimated reception decoding metric.

Aspect 39: The method of any of aspects 36 to 38, wherein receiving the signaling comprises: receiving an indication of the reception decoding metric, wherein estimating the reception decoding metric is based at least in part on the received indication.

Aspect 40: The method of any of aspects 36 to 39, wherein: the neural network model and the neural network weights correspond to a nonlinear response associated with transmissions at the second device; and the reception decoding metric comprises a second neural network model and a second one or more neural network weights associated with decoding transmissions received at the first device based at least in part on the nonlinear response.

Aspect 41: The method of any of aspects 36 to 40, further comprising: transmitting an indication configuring a periodicity of the signaling associated with the neural network model and the neural network weights, wherein receiving the signaling is based at least in part on the configured periodicity.

Aspect 42: The method of any of aspects 36 to 41, further comprising: transmitting a grant scheduling a transmission comprising the signaling associated with the neural network model and the neural network weights, wherein receiving the signaling is based at least in part on the grant.

Aspect 43: The method of any of aspects 36 to 42, wherein: the grant comprises an uplink grant in a downlink control information message; and the scheduled transmission comprises an uplink shared channel transmission.

Aspect 44: The method of any of aspects 36 to 43, wherein the reference signal comprises a set of contiguous symbols in a time domain.

It should be noted that the methods described herein describe possible implementations, and that the operations and the steps may be rearranged or otherwise modified and that other implementations are possible. Further, aspects from two or more of the methods may be combined.

Although aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR networks. For example, the described techniques may be applicable to various other wireless communications systems such as Ultra Mobile Broadband (UMB), Institute of Electrical and Electronics Engineers (IEEE) 802.11 (Wi-Fi), IEEE 802.16 (WiMAX), IEEE 802.20, Flash-OFDM, as well as other systems and radio technologies not explicitly mentioned herein.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a DSP, an ASIC, a CPU, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein may be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that may be accessed by a general-purpose or special purpose computer. By way of example, and not limitation, non-transitory computer-readable media may include RAM, ROM, electrically erasable programmable ROM (EEPROM), flash memory, compact disk (CD) ROM or other optical disk storage, magnetic disk storage or other magnetic storage devices, or any other non-transitory medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of computer-readable medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an example step that is described as "based on condition A" may be based on both a condition A and a condition B without departing from the scope of the present disclosure. In other words, as used herein, the phrase "based on" shall be construed in the same manner as the phrase "based at least in part on."

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "example" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, known structures and devices are shown in block diagram form in order to avoid obscuring the concepts of the described examples.

The description herein is provided to enable a person having ordinary skill in the art to make or use the disclosure. Various modifications to the disclosure will be apparent to a person having ordinary skill in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communications at a first device, comprising:
    transmitting an indication configuring a second device for transmission of a first reference signal with a first peak to average power ratio and for transmission of a second reference signal with a second peak to average power ratio that is greater than the first peak to average power ratio;
    receiving, from the second device, the first reference signal and the second reference signal based at least in part on transmitting the indication;
    estimating, using a neural network model and one or more neural network weights corresponding to one or more transmission parameters associated with the second device and based at least in part on a channel estimate from the first reference signal and the second reference signal, a nonlinear response associated with the second device;
    estimating a transmission encoding metric and a reception decoding metric based at least in part on the nonlinear response associated with the second device;
    transmitting signaling associated with the neural network model and the one or more neural network weights based at least in part on estimating the transmission encoding metric and the reception decoding metric; and
    communicating with the second device based at least in part on the reception decoding metric.

2. The method of claim 1, wherein transmitting the signaling comprises:
    transmitting an indication of the transmission encoding metric.

3. The method of claim 1, wherein:
    transmitting the signaling comprises transmitting a grant scheduling a transmission that is encoded based at least in part on the transmission encoding metric; and
    communicating with the second device comprises receiving the scheduled transmission.

4. The method of claim 3, wherein:
    the grant comprises an uplink grant in a downlink control information message; and
    the scheduled transmission comprises an uplink shared channel transmission.

5. The method of claim 1, further comprising:
    determining the channel estimate based at least in part on receiving the first reference signal, wherein communicating with the second device is further based at least in part on the determined channel estimate.

6. The method of claim 1, wherein:
    the neural network model and the one or more neural network weights correspond to the nonlinear response associated with the second device;
    the transmission encoding metric is associated with a second neural network model and a second one or more neural network weights associated with encoding transmissions at the second device based at least in part on the nonlinear response; and
    the reception decoding metric is associated with a third neural network model and a third one or more neural network weights associated with decoding transmissions received at the first device based at least in part on the nonlinear response.

7. The method of claim 1, wherein the first reference signal comprises a demodulation reference signal.

8. The method of claim 1, wherein the second reference signal comprises a set of contiguous symbols in a time domain.

9. A method for wireless communications at a second device, comprising:
    receiving an indication configuring the second device for transmission of a first reference signal with a first peak to average power ratio and for transmission of a second reference signal with a second peak to average power ratio that is greater than the first peak to average power ratio;
    transmitting, to a first device, the first reference signal and the second reference signal based at least in part on receiving the indication;
    receiving signaling associated with a neural network model and one or more neural network weights corresponding to one or more transmission parameters, wherein the neural network model and the one or more neural network weights are based at least in part on a channel estimate from the first reference signal and the second reference signal;
    estimating, using the neural network model and the one or more neural network weights, a nonlinear response associated with transmission components of the second device;
    estimating a transmission encoding metric based at least in part on the nonlinear response associated with the transmission components of the second device or based at least in part on the signaling comprising an indication of the transmission encoding metric; and communicating with the first device based at least in part on the transmission encoding metric.

10. The method of claim 9, wherein:

the neural network model and the one or more neural network weights correspond to the nonlinear response associated with the transmission components of the second device, and the transmission encoding metric is associated with a second neural network model and a second one or more neural network weights associated with encoding transmissions at the second device based at least in part on the nonlinear response.

11. A method for wireless communications at a second device, comprising:

receiving an indication configuring the second device for generation of a reference signal;

capturing one or more samples of the reference signal generated at the second device based at least in part on receiving the indication;

estimating, using a neural network model and one or more neural network weights corresponding to one or more transmission parameters associated with the second device and based at least in part on the one or more samples of the reference signal, a nonlinear response of transmission components of the second device;

estimating a transmission encoding metric and a reception decoding metric based at least in part on the nonlinear response of the transmission components of the second device;

transmitting signaling associated with the neural network model and the one or more neural network weights based at least in part on estimating the transmission encoding metric and the reception decoding metric; and communicating with a first device based at least in part on the transmission encoding metric.

12. The method of claim 11, wherein transmitting the signaling comprises:

transmitting, to the first device, an indication of the reception decoding metric.

13. The method of claim 11, further comprising:

receiving an indication configuring a periodicity of the signaling associated with the neural network model and the one or more neural network weights, wherein transmitting the signaling is based at least in part on the configured periodicity.

14. The method of claim 11, wherein:

the neural network model and the one or more neural network weights correspond to the nonlinear response associated with the transmission components at the second device;

the reception decoding metric is associated with a second neural network model and a second one or more neural network weights associated with decoding transmissions received at the first device based at least in part on the nonlinear response; and the transmission encoding metric associated with a third neural network model and a third one or more neural network weights associated with encoding transmissions at the second device based at least in part on the nonlinear response.

15. A method for wireless communications at a first device, comprising:

transmitting an indication configuring a second device for transmission of a first reference signal with a first peak to average power ratio and for transmission of a second reference signal with a second peak to average power ratio that is greater than the first peak to average power ratio;

receiving, from the second device, the first reference signal and the second reference signal based at least in part on transmitting the indication;

receiving signaling associated with a neural network model and one or more neural network weights corresponding to one or more transmission parameters, wherein the neural network model and the one or more neural network weights are based at least in part on a channel estimate from the first reference signal and the second reference signal;

estimating, using the neural network model and the one or more neural network weights, a nonlinear response associated with transmission components of the second device;

estimating a reception decoding metric based at least in part on the nonlinear response associated with the second device or based at least in part on the signaling comprising an indication of the reception encoding metric; and communicating with the second device based at least in part on the reception decoding metric.

16. The method of claim 15, further comprising:

transmitting a grant scheduling a transmission comprising the signaling, wherein receiving the signaling is based at least in part on the grant, and wherein the grant comprises an uplink grant in a downlink control information message and the scheduled transmission comprises an uplink shared channel transmission.

* * * * *